US012682950B2

(12) United States Patent
Naritake et al.

(10) Patent No.: US 12,682,950 B2
(45) Date of Patent: Jul. 14, 2026

(54) SEMICONDUCTOR STORAGE DEVICE FOR COMPARING REFERENCE VOLTAGES

(71) Applicant: SONY SEMICONDUCTOR SOLUTIONS CORPORATION, Kanagawa (JP)

(72) Inventors: Isao Naritake, Kanagawa (JP);
Nobuyuki Ishikawa, Kanagawa (JP);
Yoshihiko Kinoshita, Kanagawa (JP);
Tetsuo Motomura, Kanagawa (JP);
Kazufumi Ikeda, Kanagawa (JP);
Tsukasa Ojiro, Kanagawa (JP);
Tomoko Shimada, Kanagawa (JP);
Kenichi Nagamatsu, Kanagawa (JP);
Koji Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 121 days.

(21) Appl. No.: 18/704,854

(22) PCT Filed: Sep. 27, 2022

(86) PCT No.: PCT/JP2022/036022
§ 371 (c)(1),
(2) Date: Apr. 25, 2024

(87) PCT Pub. No.: WO2023/079863
PCT Pub. Date: May 11, 2023

(65) Prior Publication Data
US 2025/0006260 A1 Jan. 2, 2025

(30) Foreign Application Priority Data
Nov. 2, 2021 (JP) ................................. 2021-179703

(51) Int. Cl.
*G11C 13/00* (2006.01)

(52) U.S. Cl.
CPC ........ *G11C 13/004* (2013.01); *G11C 13/0038* (2013.01); *G11C 13/0061* (2013.01); *G11C 2013/0054* (2013.01)

(58) Field of Classification Search
CPC .............. G11C 13/004; G11C 13/0038; G11C 13/0061; G11C 2013/0054;
(Continued)

(56) References Cited

U.S. PATENT DOCUMENTS

| | | | |
|---|---|---|---|
| 9,691,499 B1* | 6/2017 | Dozaka | .............. G11C 13/0061 |
| 2013/0201773 A1* | 8/2013 | Kim | ......................... G11C 7/22 |
| | | | 365/189.14 |

FOREIGN PATENT DOCUMENTS

| | | |
|---|---|---|
| JP | 2013-251035 A | 12/2013 |
| JP | 2017-142869 A | 8/2017 |

OTHER PUBLICATIONS

International Search Report and Written Opinion of PCT Application No. PCT/JP2022/036022, issued on Dec. 20, 2022, 10 pages of ISRWO.
(Continued)

*Primary Examiner* — Jerome Leboeuf
(74) *Attorney, Agent, or Firm* — CHIP LAW GROUP

(57) ABSTRACT

A semiconductor storage device includes one or more first memory cells connected in parallel between a first voltage supply line supplying a first voltage and a second voltage supply line supplying a second voltage different from the first voltage, and one or more second memory cells connected in parallel between the second voltage supply line and a third voltage supply line supplying the first voltage, wherein each of the first memory cells includes a first storage element having a resistance value corresponding to a first status or a second status, and a first cell transistor connected between the first storage element and the first voltage supply line, and each of the second memory cells
(Continued)

includes a second storage element having a resistance value corresponding to a first status or a second status, and a second cell transistor connected between the second storage element and the third voltage supply line.

14 Claims, 16 Drawing Sheets

(58) Field of Classification Search
CPC ... G11C 11/1659; G11C 11/1673; G11C 7/14; G11C 17/16; G11C 17/18
See application file for complete search history.

(56) References Cited

OTHER PUBLICATIONS

Uhlmann, et al., "A Commercial Field-Programmable Dense eFUSE Array Memory with 99.999% Sense Yield for 45nm SOI CMOS", 2008 IEEE International Solid-State Circuits Conference—Digest of Technical Papers, Feb. 3-7, 2008, pp. 406-407.

* cited by examiner

FUSE POWER SUPPLY

6

ROW DIRECTION

COLUMN DIRECTION

BL[n]

2 MEMORY CELL ARRAY

F

MC

BL[2]

BL[1]

READOUG CIRCUIT

7

DECODER

4

1

ROW
DIRECTION

COLUMN
DIRECTION

ROW
DIRECTION

COLUMN
DIRECTION

SEMICONDUCTOR STORAGE DEVICE FOR COMPARING REFERENCE VOLTAGES

CROSS REFERENCE TO RELATED APPLICATIONS

This application is a U.S. National Phase of International Patent Application No. PCT/JP2022/036022 filed on Sep. 27, 2022, which claims priority benefit of Japanese Patent Application No. 2021-179703 filed in the Japan Patent Office on Nov. 2, 2021. Each of the above-referenced applications is hereby incorporated herein by reference in its entirety.

TECHNICAL FIELD

Embodiments according to the present disclosure relate to a semiconductor storage device.

BACKGROUND ART

Resistance random access memory elements and fuse elements have been known as typical storage elements whose resistance values change in response to a flowing current. A resistance random access memory element is a memory device that utilizes input/output of conductive ions to/from an insulating film, changes in conductivity in response to the orientation of the magnetization of a magnetic film, or a phase change of a crystal structure, and is capable of reversibly changing a resistance value.

As a fuse element, on the other hand, the one that burns through a laser beam and the one that has its resistance value controlled by electrically fusing a fuse made of, for example, polysilicon have been known (see NPL 1, for example). As another examples of the fuse element, there has been known the one that stores data on the basis of whether or not to electrically break a gate oxide film of a MOS transistor. These electrically controllable fuse elements are particularly called electric fuses (eFUSE).

CITATION LIST

Non Patent Literature

[NPL 1] Greg Uhlmann et al., "A Commercial Field-Programmable Dense eFUSE Array Memory with 99.999% Sense Yield for 45 nm SOI CMOS," Dig. ISSCC pp. 406-407, February 2008.

SUMMARY

Technical Problem

However, the electric fuses have a possibility that the reading operation cannot be performed appropriately depending on, for example, the number of write bits.

Therefore, the present disclosure provides a semiconductor storage device capable of more appropriate reading operation.

Solution to Problem

In order to solve the problem, the present disclosure provides a semiconductor storage device comprising:
one or more first memory cells connected in parallel between a first voltage supply line supplying a first voltage and a second voltage supply line supplying a second voltage different from the first voltage; and
one or more second memory cells connected in parallel between the second voltage supply line and a third voltage supply line supplying the first voltage,
wherein
each of the first memory cells includes:
a first storage element having a resistance value corresponding to a first status or a second status; and
a first cell transistor connected between the first storage element and the first voltage supply line, and
each of the second memory cells includes:
a second storage element having a resistance value corresponding to a first status or a second status; and
a second cell transistor connected between the second storage element and the third voltage supply line.

The number of first memory cells and the number of second memory cells may be the same.

The first memory cells and the second memory cells may be arranged approximately symmetrically with the second voltage supply line therebetween.

The semiconductor storage device may further include:
a voltage supply unit that, in a reading operation of the first memory cells or the second memory cells, causes the first voltage supply line and the third voltage supply line to supply the first voltage, causes the second voltage supply line to supply the second voltage, and stops the supply of the first voltage; and
a cell transistor control unit that turns on the first cell transistors of the first cells to be read or the second cell transistors of the second memory cells to be read while the supply of the first voltage is being stopped.

A potential difference between the first voltage and the second voltage may be a potential difference corresponding to a difference in voltage change rate between the first voltage supply line and the third voltage supply line that is obtained after the cell transistor control unit turns on the first cell transistors or the second cell transistors.

The second voltage supply line may be fixed to the second voltage.

The semiconductor storage device may further include:
a reference voltage generation unit that generates a reference voltage having a voltage level between a voltage that is generated by having the first storage elements and the second storage elements biased based on the first voltage and the second voltage, the first storage elements and the second storage elements having a resistance value corresponding to the first status, and a voltage that is generated by having the first storage elements and the second storage elements biased based on the first voltage and the second voltage, the first storage elements and the second storage element having a resistance value corresponding to the second status; and a comparison unit that compares the reference voltage with a voltage that is generated by having the first storage elements or the second storage elements biased based on the first voltage and the second voltage.

The reference voltage generation unit may be configured to include:
a first reference voltage generation unit that is connected between the first voltage supply line and the second voltage supply line and generates the reference voltage when a reading operation of the second memory cells is performed; and
a second reference voltage generation unit that is connected between the second voltage supply line and the third voltage supply line and generates the reference voltage when a reading operation of the first memory cells is performed.

The first reference voltage generation unit and the second reference voltage generation unit may be arranged approximately symmetrically with the second voltage supply line therebetween.

The first reference voltage generation unit may be configured to include:

a first reference resistance element; and a first reference transistor that is connected between the first reference resistance element and the first voltage supply line, and the second reference voltage generation unit may be configured to include:

a second reference resistance element; and a second reference transistor that is connected between the second reference resistance element and the third voltage supply line.

The comparison unit may be configured to compare the reference voltage with the voltage that is generated by having the first storage elements or the second storage elements biased based on the first voltage and the second voltage, by comparing a voltage of the first voltage supply line with a voltage of the third voltage supply line, and the semiconductor storage device may further include a comparison control unit that causes the comparison unit to start comparing at a timing corresponding to the voltages of the first voltage supply line and the third voltage supply line.

The comparison control unit may be configured to, when the first voltage is higher than the second voltage, cause the comparison unit to start comparing at a timing at which the voltage of at least either one of the first voltage supply line and the third voltage supply line becomes lower than a first predetermined value, and when the first voltage is lower than the second voltage, cause the comparison unit to start comparing at a timing at which the voltage of at least either one of the first voltage supply line and the third voltage supply line becomes higher than a second predetermined value.

In a reading operation, the first voltage may be higher than the second voltage.

In a writing operation, the first voltage may be lower than the second voltage, and the second voltage obtained in a writing operation may be higher than the first voltage obtained in a reading operation.

In a writing operation, the first voltage may be higher than the second voltage, and the first voltage obtained in a writing operation may be higher than the first voltage obtained in a reading operation.

In a reading operation, the first voltage may be lower than the second voltage.

In a writing operation, the first voltage may be lower than the second voltage, and the second voltage obtained in a writing operation may be higher than the second voltage obtained in a reading operation.

DESCRIPTION OF EMBODIMENTS

Hereinafter, embodiments of a semiconductor storage device will be described with reference to the drawings. Hereinafter, main components of the semiconductor storage device will be mainly described, but the semiconductor storage device may have components or functions that are not illustrated or described. The following description does not exclude components or functions that are not illustrated or described.

First Embodiment

[Configuration Example of Semiconductor Storage Device]

Figure 1:
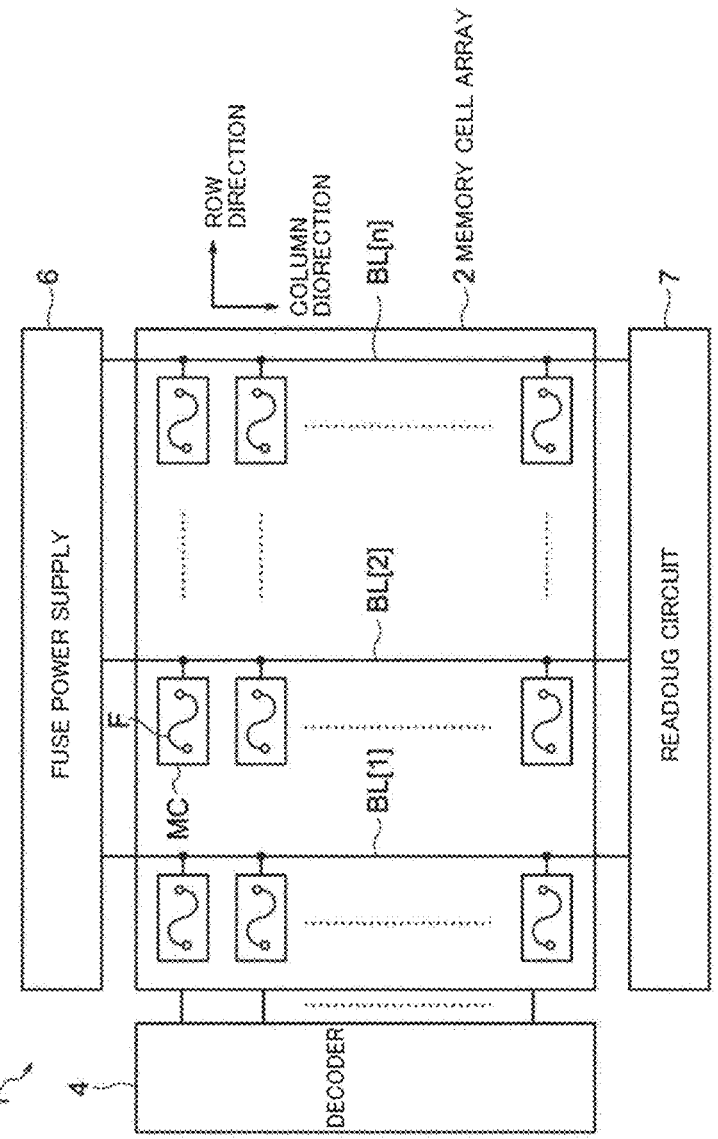
FIG. 1 is a schematic view showing a configuration example of a semiconductor storage device according to a first embodiment.

FIG. 1 is a schematic view showing a configuration example of a semiconductor storage device 1 according to a first embodiment. FIG. 1 shows main parts of the semiconductor storage device 1.

The semiconductor storage device 1 shown in FIG. 1 includes a memory cell array 2, a decoder 4, a fuse (FUSE) power supply 6, and a readout circuit 7.

The semiconductor storage device 1 has m (row)×n (column) memory cells MC arranged in a matrix in the memory cell array 2. In the present embodiment, for example, m and n are integers equal to or greater than 2, but, for example, m may be 1 and n may be an integer equal to or greater than 2.

The semiconductor storage device 1 has a function of selecting a desired memory cell MC from among the plurality of memory cells MC, a function of writing data into the selected memory cell MC, and a function of reading the data from the selected memory cell MC.

One memory cell MC has a fuse element F as a memory element and stores one-bit data ("0" or "1"). Note that the memory cells MC shown in FIG. 1 each show a simplified fuse element F. The fuse element F is an electric fuse (eFUSE) capable of having a resistance value thereof controlled electrically and irreversibly, for example. Hereinafter, the fuse element F is described as an electric fuse made of, for example, polysilicon.

The resistance value of the fuse element F increases by an order of magnitude by changing the composition of a wiring material when a large current flows. Hereinafter, applying a large current to the fuse element F is also referred to as "blow." For example, by blowing the fuse element F, the resistance value thereof changes from a low resistance value (e.g., approximately 100Ω) to a high resistance value (e.g., approximately 50 kΩ).

In the present embodiment as well, the low resistance value refers to an initial resistance value obtained prior to applying a current to the fuse element F. The high resistance value refers to a resistance value obtained after blowing the fuse element F. As a result of blowing the fuse element F, in some cases the resistance value thereof becomes equivalent to a resistance value of a reference resistance element (a first reference resistance element RF1 and a second reference resistance element RF2) (see FIG. 2).

Here, the state in which the resistance value of the fuse element F is the low resistance value (first status) is associated with "0" and therefore also referred to as "unwritten status." On the other hand, the state in which the resistance value of the fuse element F (second status) is the high resistance value is associated with "1" and therefore also referred to as "write status."

Thus, depending on the resistance value of the fuse element F, the memory cells MC store one-bit data of "0" or "1." Accordingly, changing the resistance value of the fuse element F from a low resistance value to a high resistance value is also simply referred to as "writing (of memory cells MC)" or "program."

When reading a memory cell MC, the fuse element F is biased. Then, by comparing a voltage that is output to a first read bit line RBLL and a second read bit line RBLR (see FIG. 2) on a bit line BL [n] with a reference voltage, the resistance value of the fuse element F of the memory cell MC, that is, "0" or "1," is read by the readout circuit 7.

The decoder 4 controls the operation of each of the memory cells MC of the memory cell array 2. Basically, the decoder 4 selects a memory cell MC to be read or written.

The fuse power supply 6 is connected to the bit line BL [n]. At the time of writing of the memory cell MC, the fuse power supply 6 supplies a fuse power supply voltage VDD-FIL (>power supply voltage VDD) to the fuse element F in order to bias the fuse element F.

Figure 2:
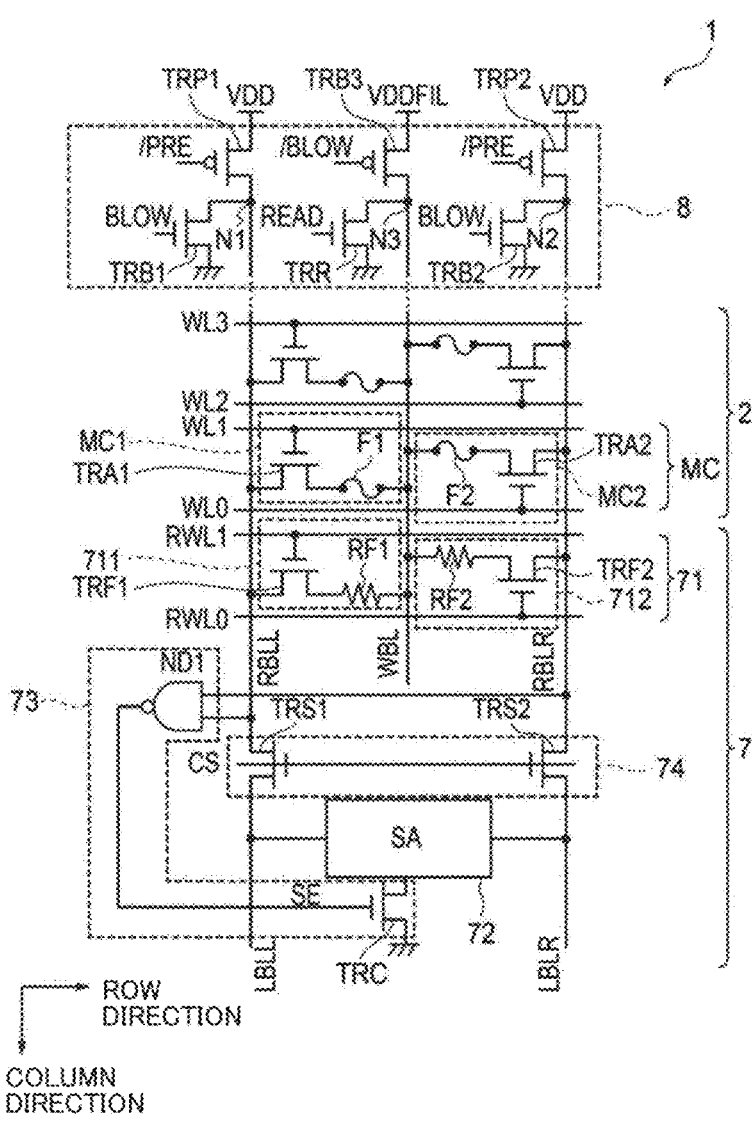
FIG. 2 is a circuit diagram showing a detailed configuration example of the semiconductor storage device according to the first embodiment.

The readout circuit 7 includes, for example, a function of selecting the bit line BL [n], a comparison unit 72 (see FIG. 2), and a reference voltage generation unit 71 (see FIG. 2).

At the time of reading, the readout circuit 7 reads data from the memory cell MC to be read.

[Details of Semiconductor Storage Device]

Next, the m (row)×n (column) memory cells MC and constituent elements associated therewith will be described with respect to FIG. 2.

FIG. 2 is a circuit diagram showing a detailed configuration example of the semiconductor storage device according to the first embodiment.

As shown in FIG. 2, the bit line BL [n] includes the first read bit line RBLL, the second read bit line RBLR, and a write bit line WBL.

The first read bit line (first voltage supply line) RBLL supplies a predetermined voltage (first voltage) so that the fuse element F and the reference resistance element can be biased. Biasing refers to, for example, voltage application. Note that the fuse element F includes a first fuse element F1 and a second fuse element F2 as shown in FIG. 2. The reference resistance element includes the first reference resistance element RF1 and the second reference resistance element RF2 as shown in FIG. 2.

The second read bit line (third voltage supply line) RBLR supplies the first voltage so that the fuse element F and the reference resistance element can be biased.

The write bit line (second voltage supply line) WBL supplies a predetermined voltage (second voltage) different from the first voltage so that the fuse element F and the reference resistance element can be biased.

In the example shown in FIG. 2, the first voltage in a writing operation is, for example, a ground voltage (0 V). The second voltage in a writing operation is, for example, the fuse power supply voltage VDDFIL. Thus, in a writing operation, the first voltage is lower than the second voltage. The first voltage in a reading operation is, for example, the power supply voltage (reference voltage) VDD. The second voltage in a reading operation is, for example, a ground voltage. Thus, in a reading operation, the first voltage is higher than the second voltage. Note that the second voltage in a writing operation (fuse power supply voltage VDDFIL) is higher than the first voltage in a reading operation (power supply voltage VDD). The fuse power supply voltage VDD-FIL is, for example, approximately 1.8 V. The power supply voltage VDD is, for example, approximately 0.8 V.

The memory cells MC have a first memory cell MC1 and a second memory cell MC2. The first memory cell MC1 is arranged on the left column of the two columns of memory cells MC shown in FIG. 2. The second memory cell MC2 is arranged on the right column of the two columns of memory cell MC shown in FIG. 2.

One or more first memory cells MC1 are connected in parallel between the first read bit line RBLL and the write bit line WBL. One or more second memory cells MC2 are connected in parallel between the write bit line WBL and the second read bit line RBLR. Although FIG. 2 shows that four memory cells MC are arranged in two columns (2 bits)×two rows (2 rows), the arrangement of a plurality of memory cells MC is not limited to that shown in FIG. 2; thus, the memory cells MC may be arranged in one row, for example. Note in the following description that a plurality of memory cells MC are arranged in the form of a plurality of columns×a plurality of rows unless otherwise particularly stated.

Also, the number of first memory cells MC1 and the number of second memory cells MC2 are the same. The first memory cells MC1 and the second memory cells MC2 are arranged approximately symmetrically (bilaterally symmetrically) with the write bit line WBL therebetween. Therefore, as will be described hereinafter, the capacitance is approximately the same between the first read bit line RBLL and the second read bit line RBLR.

As shown in FIG. 2, the first memory cell MC1 and the second memory cell MC2 that are arranged in two columns are constituted as one unit. The first memory cell MC1 and the second memory cell MC2 that are arranged in two columns may be arranged in a plurality of units in the row direction.

The configuration in which a plurality of memory cells MC are arranged in the column direction is referred to as a bit configuration, hereinafter. FIG. 2 illustrates one bit configuration in two columns. However, other bit configurations may not necessarily be identical to each other. Hereinafter, one bit configuration will be described in view of the fact that a plurality of bit configurations are identical to each other.

The first memory cell MC1 has the first fuse element F1 and a first access transistor TRA1.

The first fuse element (first storage element) F1 is connected between the first read bit line RBLL (first access transistor TRA1) and the write bit line WBL. The first fuse element F1 has a resistance value corresponding to the first status or the second status.

The first access transistor (first cell transistor) TRA1 is connected between the first fuse element F1 and the first read bit line RBLL. Therefore, the first fuse element F1 is connected to the first read bit line RBLL via the first access transistor TRA1 without being connected directly to the first read bit line RBLL. Thus, as will be described hereinafter, a reading operation can be performed appropriately.

Further, a gate of the first access transistor TRA1 is connected to each of word lines WL1, WL3, etc. By turning the first access transistor TRA1 on, the first fuse element F1 is biased by the fuse power supply voltage VDDFIL or the power supply voltage VDD. The first access transistor TRA1 is, for example, an NMOS (n-channel Metal Oxide Semiconductor) transistor.

In the example shown in FIG. 2, the first fuse element F1 and the first access transistor TRA1 are connected in series.

The second memory cell MC2 has the second fuse element F2 and a second access transistor TRA2.

The second fuse element (second storage element) F2 is connected between the write bit line WBL and the second read bit line RBLR (second access transistor TRA2). The second fuse element F2 has a resistance value corresponding to the first status or the second status.

The second access transistor (second cell transistor) TRA2 is connected between the second fuse element F2 and the second read bit line RBLR. Therefore, the second fuse element F2 is connected to the second read bit line RBLR via the second access transistor TRA2 without being connected directly to the second read bit line RBLR. Thus, as will be described hereinafter, a reading operation can be performed appropriately.

Further, a gate of the second access transistor TRA2 is connected to each of word lines WL0, WL2, etc. By turning the second access transistor TRA2 on, the second fuse element F2 is biased by the fuse power supply voltage VDDFIL or the power supply voltage VDD. The second access transistor TRA2 is, for example, an NMOS transistor.

In the example shown in FIG. 2, the second fuse element F2 and the second access transistor TRA2 are connected in series.

The semiconductor storage device of the present embodiment includes a plurality of word lines WL0, WL1, WL2, etc. extending in the row direction. Each of the word lines WL0, WL1, WL2, etc. turns the first access transistor TRA1 and the second access transistor TRA2 on or off in each memory cell MC.

In the example shown in FIG. 2, the word lines WL0, WL2 turn on or off the second access transistor TRA2 of the second memory cell MC2 on the right side. The word lines WL1, WL3 turn on or off the first access transistor TRA1 of the first memory cell MC1 on the left side.

The readout circuit 7 has the reference voltage generation unit 71, the comparison unit 72, a comparison control unit 73, and a bit line separation unit 74. In some cases the comparison unit 72 is also called a sense amplifier (SA).

In a reading operation, the reference voltage generation unit 71 generates a reference voltage to be compared with a voltage generated by the biasing of the fuse element F. The reference voltage has a voltage level between a voltage that is generated as a result of the first fuse element F1 and the second fuse element F2 being biased based on the first voltage and the second voltage, the first and second fuse elements having resistance values corresponding to the first status, and a voltage that is generated as a result of the first fuse element F1 and the second fuse element F2 being biased based on the first voltage and the second voltage, the first and second fuse elements having resistance values corresponding to the second status.

The reference voltage generation unit 71 has a first reference voltage generation unit 711 and a second reference voltage generation unit 712.

The first reference voltage generation unit 711 is connected between the first read bit line RBLL and the write bit line WBL. The first reference voltage generation unit 711 generates a reference voltage when a reading operation on the second memory cell MC2 is performed. The second reference voltage generation unit 712 is connected between the write bit line WBL and the second read bit line RBLR. The second reference voltage generation unit 712 generates a reference voltage when a reading operation on the first memory cell MC1 is performed. In the example shown in FIG. 2, the first reference voltage generation unit 711 and the second reference voltage generation unit 712 are arranged approximately symmetrically (bilaterally symmetrically) with the write bit line WBL therebetween.

The reference voltage generation unit 711 has the first reference resistance element RF1 and a first reference transistor TRF1.

The first reference resistance element RF1 is connected between the first read bit line RBLL (first reference transistor TRF1) and the write bit line WBL.

The first reference transistor TRF1 is connected between the first reference resistance element RF1 and the first read bit line RBLL. Therefore, the first reference resistance element RF1 is connected to the first read bit line RBLL via the first reference transistor TRF1 without being connected directly to the first read bit line RBLL.

Furthermore, a gate of the first reference transistor TRF1 is connected to a word line RWL1. By turning the first reference transistor TRF1 on, the first reference resistance element RF1 is biased by the power supply voltage VDD. The first reference transistor TRF1 is, for example, an NMOS transistor.

In the example shown in FIG. 2, the first reference resistance element RF1 and the first reference transistor TRF1 are connected in series.

The second reference voltage generation unit 712 has the second reference resistance element RF2 and a second reference transistor TRF2.

The second reference resistance element RF2 is connected between the write bit line WBL and the second read bit line RBLR (second reference transistor TRF2).

The second reference transistor TRF2 is connected between the second reference resistance element RF2 and the second read bit line RBLR. Therefore, the second reference resistance element RF2 is connected to the second read bit line RBLR via the second reference transistor TRF2 without being connected directly to the second read bit line RBLR.

Furthermore, a gate of the second reference transistor TRF2 is connected to a word line RWL0. By turning the second reference transistor TRF2 on, the second reference resistance element RF2 is biased by the power supply voltage VDD. The second reference transistor TRF2 is, for example, an NMOS transistor.

In the example shown in FIG. 2, the second reference resistance element RF2 and the second reference transistor TRF2 are connected in series.

The first reference resistance element RF1, the second reference resistance element RF2, the first reference transistor TRF1, and the second reference transistor TRF2 are arranged approximately laterally symmetrically with the write bit line WBL therebetween.

Also, the first reference resistance element RF1 and the second reference resistance element RF2 have, for example, approximately the same resistance value.

The comparison unit 72 compares the reference voltage with a voltage that is generated by the first fuse element F1 or the second fuse element F2 being biased based on the first voltage and the second voltage. More specifically, the comparison unit 72 compares a voltage of the first read bit line RBLL with a voltage of the second read bit line RBLR. Specifically, when reading of the first memory cell MC1 is performed, the decoder 4 selects the first memory cell MC1 and the second reference voltage generation unit 712, and the comparison unit 72 compares the voltages of the two bit lines. When reading of the second memory cell MC2 is performed, the decoder 4 selects the second memory cell MC2 and the first reference voltage generation unit 711, and the comparison unit 72 compares the voltages of the two bit lines. Consequently, the resistance value of the fuse element F of the memory cell MC to be read, that is, the unwritten status ("0") or the write status ("1"), is read out. More specifically, the comparison unit 72 compares the voltages between the two bit lines by amplifying a potential difference therebetween.

The comparison control unit 73 causes the comparison unit 72 to start comparing at a timing corresponding to the voltages of the first read bit line RBLL and the voltage of the second read bit line RBLR.

The comparison control unit 73 has a NAND circuit ND1 and a comparison control transistor TRC.

Two input units of the NAND circuit ND1 are electrically connected to the first read bit line RBLL and the second read bit line RBLR. An output unit of the NAND circuit ND1 is electrically connected to a gate of the comparison control transistor TRC. When the voltage of at least either one of the first read bit line RBLL and the second read bit line RBLR is smaller than a first predetermined value, the NAND circuit ND1 outputs a high signal.

The comparison control transistor TRC is connected between the comparison unit 72 and the ground. The gate of the comparison control transistor TRC is connected to an output of the NAND circuit ND1 and receives an input of a signal SE. The comparison control transistor TRC is turned on by the output of the high signal SE from the NAND circuit ND1. The comparison control transistor TRC causes the comparison unit 72 to start comparing by being turned on.

The bit line separation unit 74 electrically separates a bit line. This can curb the impact of the capacitance of the bit line when the comparison unit 72 amplifies the potential difference. As a result, power consumption can be reduced.

The bit line separation unit 74 has a first separation transistor TRS1 and a second separation transistor TRS2.

The first separation transistor TRS1 is connected between the first read bit line RBLL and a first separation read bit line LBLL. A signal CS is input to a gate of the first separation transistor TRS1. By being turned on, the first separation transistor TRS1 electrically connects the first read bit line RBLL and the first separation read bit line LBLL, and by being turned off, the first separation transistor TRS1 electrically disconnects the first read bit line RBLL and the first separation read bit line LBLL. The first separation transistor TRS1 is, for example, an NMOS transistor.

Note that, by wiring not shown, for example, the signal CS has a signal level corresponding to the signal level of the signal SE output from the NAND circuit ND1.

The second separation transistor TRS2 is connected between the second read bit line RBLR and a second separation read bit line LBLR. The signal CS is input to a gate of the second separation transistor TRS2. By being turned on, the second separation transistor TRS2 electrically connects the second read bit line RBLR and the second separation read bit line LBLR, and by being turned off, the second separation transistor TRS2 electrically disconnects the second read bit line RBLR and the second separation read bit line LBLR. The second separation transistor TRS2 is, for example, an NMOS transistor.

The semiconductor storage device 1 further includes a voltage supply unit 8. Note that the illustration of the voltage supply unit 8 is omitted in FIG. 1. The voltage supply unit 8 is connected between the fuse power supply 6 and the memory cell array 2. The voltage supply unit 8 controls the supply of voltages by the write bit line WBL, the first read bit line RBLL, and the second read bit line RBLR. An operation of the voltage supply unit 8 is controlled by, for example, the decoder 4.

The voltage supply unit 8 has a first blow transistor TRB1, a second blow transistor TRB2, a third blow transistor TRB3, a read transistor TRR, a first pre-charge transistor TRP1, and a second pre-charge transistor TRP2.

The first blow transistor TRB1 is connected between a node N1 and the ground. On the first read bit line RBLL, the node N1 is provided between the power supply voltage node VDD (first pre-charge transistor TRP1) and the memory cell array 2. A BLOW signal is input to a gate of the first blow transistor TRB1. By turning the first blow transistor TRB1 on, a writing operation of the first memory cell MC1 is performed. The first blow transistor TRB1 is, for example, an NMOS transistor.

The second blow transistor TRB2 is connected between a node N2 and the ground. On the second read bit line RBLR, the node N2 is provided between the power supply voltage node VDD (second pre-charge transistor TRP2) and the memory cell array 2. A BLOW signal is input to a gate of the second blow transistor TRB2. By turning the second blow transistor TRB2 on, a writing operation of the second memory cell MC2 is performed. The second blow transistor TRB2 is, for example, an NMOS transistor.

The third blow transistor TRB3 is connected between a node N3 and the fuse power supply voltage node VDDFIL. On the write bit line WBL, the node N3 is provided between the fuse power supply voltage node VDDFIL and the memory cell array 2. A /BLOW signal is input to a gate of the third blow transistor TRB3. By turning the third blow transistor TRB3 on, a writing operation of the first memory cell MC1 or the second memory cell MC2 is performed. The third blow transistor TRB3 is, for example, a PMOS (p-channel Metal Oxide Semiconductor) transistor.

The read transistor TRR is connected between the node N3 and the ground. On the write bit line WBL, the node N3 is provided between the fuse power supply voltage node VDDFIL (third blow transistor TRB3) and the memory cell array 2. A READ signal is input to a gate of the read transistor TRR. By turning the read transistor TRR on, a reading operation of the first memory cell MC1 or the second memory cell MC2 is performed. The read transistor TRR is, for example, an NMOS transistor.

The first pre-charge transistor TRP1 is connected between a power supply voltage node VDD and the memory cell array 2 (node N1). A /PRE signal is input to a gate of the first pre-charge transistor TRP1. By turning the first pre-charge transistor TRP1 on, pre-charge of the first read bit line RBLL is performed in a reading operation. Note that details of pre-charge will be described hereinafter with reference to FIG. 4. The first pre-charge transistor TRP1 is, for example, a PMOS transistor.

The second pre-charge transistor TRP2 is connected between a power supply voltage node VDD and the memory cell array 2 (node N2). A /PRE signal is input to a gate of the second pre-charge transistor TRP2. By turning the second pre-charge transistor TRP2 on, pre-charge of the second read bit line RBLR is performed in a reading operation. Note that details of pre-charge will be described hereinafter with reference to FIG. 4. The second pre-charge transistor TRP2 is, for example, a PMOS transistor.

[Writing Operation of Semiconductor Storage Device]

Figure 3:
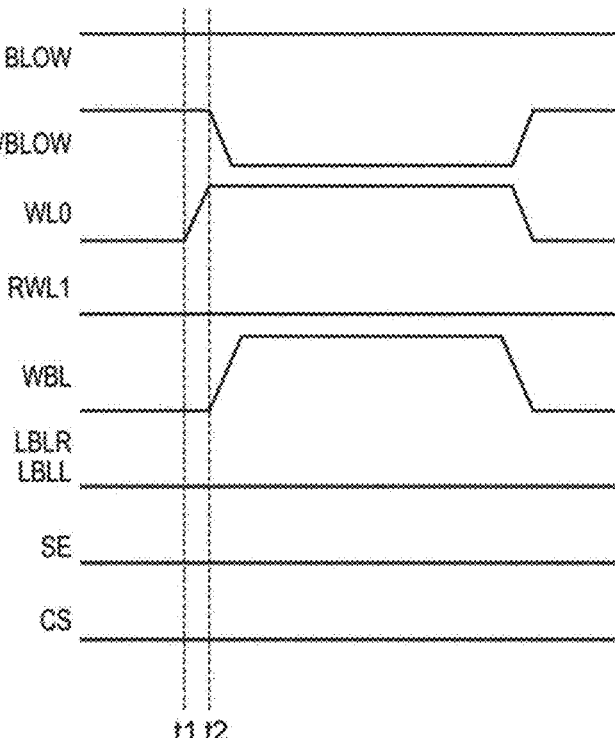
FIG. 3 is a timing chart showing an example of a writing operation of the semiconductor storage device according to the first embodiment.

FIG. 3 is a timing chart showing an example of a writing operation of the semiconductor storage device according to the first embodiment. FIG. 3 shows a timing chart of a writing operation of the second memory cell MC2.

In an initial state, the BLOW signal is in a high state. Thus, the first blow transistor TRB1 and the second blow transistor TRB2 are in an ON state. The/BLOW signal is in a high state. Thus, the third blow transistor TRB3 is in an OFF state. The signals of the word lines WL0, RWL1 are in a low state.

Therefore, the second access transistor TRA2 and the first reference transistor TRF1 are in an OFF state.

First, at time t1, the signal of the word line WL0 is high. Thus, the second access transistor TRA2 turns on.

Next, at time t2, the/BLOW signal is low. Therefore, the third blow transistor TRB3 turns on. As a result, the voltage of the write bit line WBL rises, and the second fuse element F2 becomes biased by the fuse power supply voltage VDD-FIL and enters a write status.

Thereafter, the/BLOW signal becomes high and the signal of the word line WL0 becomes low. Thus, the third blow transistor TRB3 turns off and the second access transistor TRA2 turns off.

During the writing operation, the signal SE is in a low state. Therefore, the comparison control transistor TRC is in an OFF state. The signal CS is in a low state. Therefore, the first separation transistor TRS1 and the second separation transistor TRS2 are in an OFF state. That is, the first read bit line RBLL and the second read bit line RBLR are electrically disconnected from the first separation read bit line LBLL and the second separation read bit line LBLR, respectively.

Further, although FIG. 3 does not show the READ signal and/PRE signal, the read transistor TRR, the first pre-charge transistor TRP1, and the second pre-charge transistor TRP2 are in an OFF state during the writing operation.

[Reading Operation of Semiconductor Storage Device]

Figure 4:
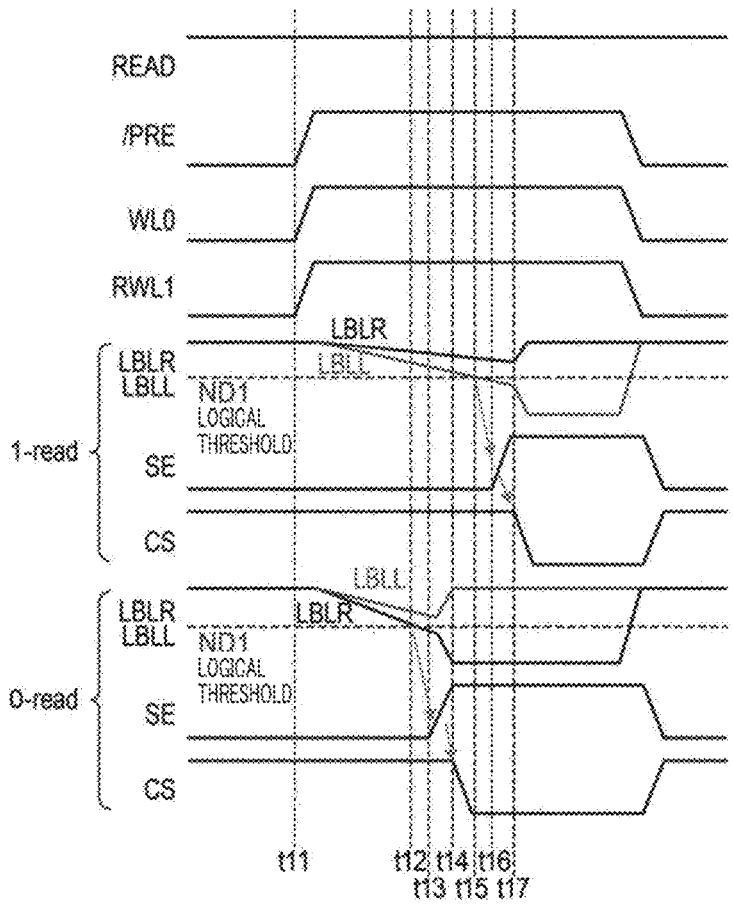
FIG. 4 is a timing chart showing an example of a reading operation of the semiconductor storage device according to the first embodiment.

FIG. 4 is a timing chart showing an example of a reading operation of the semiconductor storage device according to the first embodiment. FIG. 4 shows a timing chart of a reading operation of the second memory cell MC2.

In the reading operation, charges are extracted from the first read bit line RBLL and the second read bid line RBLR which have been pre-charged to the power supply voltage VDD, to the write bit line WBL discharged to 0 V. The voltage of the fuse element F and the voltage of the reference resistance element are compared when the charges are extracted. As a result, the write status (0/1) of the memory cell MC is read out.

In the reading operation of the first memory cell MC1 or the second memory cell MC2, the voltage supply unit 8 causes the first read bit line RBLL and the second read bit line RBLR to supply the first voltage in advance, and causes the write bit line WBL to supply the second voltage in advance. In this manner, pre-charge is performed. Thereafter, the voltage supply unit 8 causes the first read bit line RBLL and the second read bit line RBLR to stop supplying the first voltage.

While the supply of the first voltage is stopped, the decoder (cell transistor control unit) 4 turns on the first access transistor TRA1 possessed by the first memory cell MC1 to be read or the second access transistor TRA2 possessed by the second memory cell MC2 to be read. The extraction of charges is performed in this manner.

In the initial state, the READ signal is in a high state. Thus, the read transistor TRR is in an ON state. As a result, the write bit line WBL is discharged to 0 V, for example. The /PRE signal is in a low state. Thus, the first pre-charge transistor TRP1 and the second pre-charge transistor TRP2 are in an ON state. The signals of the word lines WL0, RWL1 are in a low state. Therefore, the second access transistor TRA2 and the first reference transistor TRF1 are in an OFF state.

Further, in the initial state, the signal SE is in a low state. Therefore, the comparison control transistor TRC is in an OFF state. The signal CS is in a high state. Thus, the first separation transistor TRS1 and the second separation transistor TRS2 are in an ON state. That is, the first read bit line RBLL and the second read bit line RBLR are electrically connected to the first separation read bit line LBLL and the second separation read bit line LBLR, respectively.

In the initial state, the voltages of the first separation read bit line LBLL (first read bit line RBLL) and the second separation read bit line LBLR (second read bit line RBLR) are pre-charged to the power supply voltage VDD. All the first access transistors TRA1, all the second access transistors TRA2, the first reference transistor TRF1, and the second reference transistor TRF2, which are shown in FIG. 2, are in an OFF state. Therefore, regardless of whether the status of the memory cell MC is the write status ("1") or unwritten status ("0"), charges accumulate in the first separation read bit line LBLL and the second separation read bit line LBLR without being extracted.

Further, at time t11, the /PRE signal becomes high. In this manner, the first pre-charge transistor TRP1 and the second pre-charge transistor TRP2 are turned off. The signals of the word lines WL0, RWL1 become high at substantially the same time. In this manner, the second access transistor TRA2 and the first reference transistor TRF1 are turned on at substantially the same time. As a result, after the time t11, the voltages of the first separation read bit line LBLL and the second separation read bit line LBLR are lowered. This is because the charges accumulated in the first separation read bit line LBLL and the second separation read bit line LBLR flow through the write bit line WBL. The current flowing through the write bit line WBL flows to the ground connected to a source of the read transistor TRR.

Here, the rate of decrease of voltage differs between the first separation read bit line LBLL and the second separation read bit line LBLR. The rate of decrease of the voltage of the first separation read bit line LBLL is determined by the resistance value of the first reference resistance element RF1. Therefore, the rate of decrease of the voltage of the first separation read bit line LBLL does not change by the status (0/1) of the second fuse element F2 possessed by the second memory cell MC2. On the other hand, the rate of decrease of the voltage of the second separation read bit line LBLR changes by the status (0/1) of the second fuse element F2 possessed by the second memory cell MC2.

First, a reading operation performed when the second memory cell MC2 is in the write status will be described (1-read).

Since the resistance value of the second fuse element F2 of the second memory cell MC2 is greater than the resistance value of the first reference resistance element RF1, the rate of decrease of the voltage of the second separation read bit line LBLR is slower than the rate of decrease of the voltage of the first separation read bit line LBLL.

At time t15, the voltage of the first separation read bit line LBLL becomes lower than the logical threshold (first predetermined value) of the NAND circuit ND1. Consequently, at time t16, the NAND circuit ND1 inputs the signal SE that changes from low to high, to the gate of the comparison control transistor TRC. In addition, due to the signal SE becoming high, the signal CS becomes low at time t17. Consequently, the first separation transistor TRS1 and the second separation transistor TRS2 are turned off. As a result, the first read bit line RBLL and the second read bit line RBLR are electrically disconnected from the first separation read bit line LBLL and the second separation read bit line LBLR, respectively.

At time t16, the comparison control transistor TRC is turned on, thereby voltage comparison by the comparison unit 72 is performed. That is, the comparison control unit 73 causes the comparison unit 72 to start the comparison at a timing at which the voltage of at least either one of the first read bit line RBLL and the second read bit line RBLR becomes lower than the first predetermined value. After the time t16, the comparison unit 72 performs the comparison by amplifying the potential difference between the first separation read bit line LBLL and the second separation read bit line LBLR.

Subsequently, the /PRE signal becomes low, and the signals of the word lines WL0, RWL1 become low. Consequently, the first pre-charge transistor TRP1 and the second pre-charge transistor TRP2 are turned on, and the second access transistor TRA2 and the first reference transistor TRF1 are turned off.

Next, a reading operation performed when the second memory cell MC2 is in the unwritten status will be described (0-read).

Since the resistance value of the second fuse element F2 of the second memory cell MC2 is lower than the resistance value of the first reference resistance element RF1, the rate of decrease of the voltage of the second separation read bit line LBLR is faster than the rate of decrease of the voltage of the first separation read bit line LBLL.

At time t12, the voltage of the second separation read bit line LBLR becomes lower than the logical threshold (first predetermined value) of the NAND circuit ND1. Consequently, at time t13, the NAND circuit ND1 inputs the signal SE that changes from low to high, to the gate of the comparison control transistor TRC. In addition, due to the signal SE becoming high, the signal CS becomes low at time t14. Consequently, the first separation transistor TRS1 and the second separation transistor TRS2 are turned off. As a result, the first read bit line RBLL and the second read bit line RBLR are electrically disconnected from the first separation read bit line LBLL and the second separation read bit line LBLR, respectively.

At time t13, the comparison control transistor TRC is turned on, thereby voltage comparison by the comparison unit 72 is performed. That is, the comparison control unit 73 causes the comparison unit 72 to start the comparison at a timing at which the voltage of at least either one of the first read bit line RBLL and the second read bit line RBLR becomes lower than the first predetermined value. After the time t13, the comparison unit 72 performs the comparison by amplifying the potential difference between the first separation read bit line LBLL and the second separation read bit line LBLR.

Subsequently, the /PRE signal becomes low, and the signals of the word lines WL0, RWL1 become low. Consequently, the first pre-charge transistor TRP1 and the second pre-charge transistor TRP2 are turned on, and the second access transistor TRA2 and the first reference transistor TRF1 are turned off.

As shown in FIG. 4, the timing at which the comparison is started by the comparison unit 72 differs depending on the status (0/1) of the second memory cell MC2. That is, the timing from a voltage rise in the word lines to the sense amplifier activation is determined in a self-alignment manner based on the rate at which either the first separation read bit line LBLL or the second separation read bit line LBLR whichever becomes lower than the logical threshold (first predetermined value) of the NAND circuit ND1 first.

Note that FIG. 4 does not show the BLOW signal and/BLOW signal, but the first blow transistor TRB1, the second blow transistor TRB2, and the third blow transistor TRB3 are in an OFF state.

As described above, according to the first embodiment, the first memory cell MC1 is connected between the first read bit line RBLL and the write bit line WBL. The first access transistor TRA1 is connected between the first fuse element F1 and the first read bit line RBLL. The second memory cell MC2 is connected between the write bit line WBL and the second read bit line RBLR. The second access transistor TRA2 is connected between the second fuse element F2 and the second read bit line RBLR. Thus, as will be described hereinafter with reference to FIGS. 5 and 6, the capacities of the first read bit line RBLL and the second read bit line RBLR can be made approximately constant regardless of the statuses of the first fuse element F1 and the second fuse element F2. As a result, the reading operation of the first memory cell MC1 or the second memory cell MC2 can be performed more appropriately.

Furthermore, the connection relation (arrangement) between the first reference transistor TRF1 and the second reference transistor TRF2 corresponds to the connection relation between the first access transistor TRA1 and the second access transistor TRA2. Accordingly, comparison of characteristics such as the potential difference between the memory cell MC and the reference voltage generation unit 71 can be performed more appropriately. However, the present invention is not limited thereto, and the first reference transistor may be connected between the first reference resistance element RF1 and the write bit line WBL. The second reference resistance element RF2 may be connected between the second reference resistance element RF2 and the write bit line WBL.

Comparative Example

Figure 5:
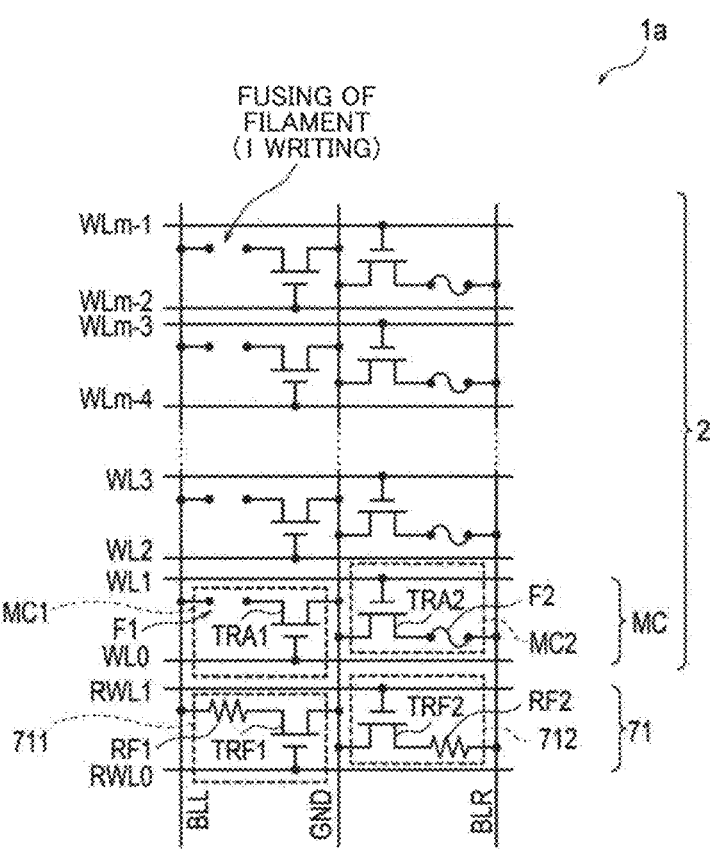
FIG. 5 is a circuit diagram for explaining a bit line capacitance of a semiconductor storage device according to a comparative example.
Figure 6:
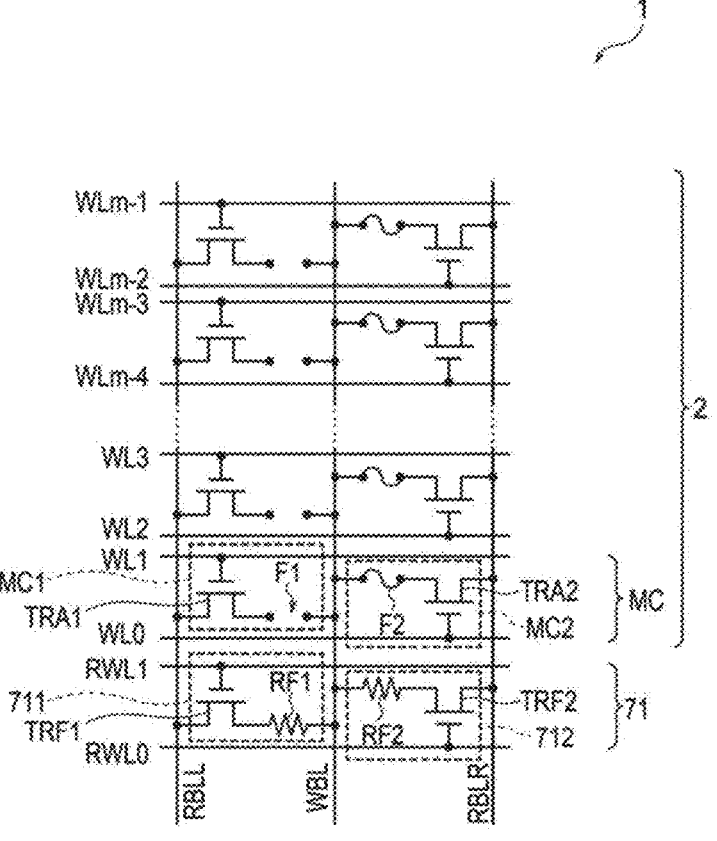
FIG. 6 is a circuit diagram for explaining a bit line capacitance of the semiconductor storage device according to the first embodiment.

FIG. 5 is a circuit diagram for explaining a bit line capacitance of a semiconductor storage device 1a according to a comparative example. FIG. 6 is a circuit diagram for explaining a bit line capacitance of the semiconductor storage device 1 according to the first embodiment.

The comparative example is different from the first embodiment in terms of the arrangement of the fuse elements and access transistors in the memory cells MC. Note, in FIG. 5, that a first bit line BLL and a second bit line BLR are provided in place of the first read bit line RBLL and the second read bit line RBLR. Similarly, a ground line GND is provided in place of the write bit line WBL.

The first access transistor TRA1 of the first memory cell MC1 is connected between the first fuse element F1 and the ground line GND. Therefore, the first fuse element F1 is connected directly to the first bit line BLL.

The second access transistor TRA2 of the second memory cell MC2 is connected between the second fuse element F2 and the ground line GND. Therefore, the second fuse element F2 is connected directly to the second bit line BLR.

[Comparison of Bit Line Capacitance]

In FIGS. 5 and 6, the first fuse element F1 (filament) of the first memory cell MC1 arranged on the left side is fused. That is, all of the first memory cells MC1 are in the write status. On the other hand, the second fuse element F2 of the second memory cell MC2 arranged on the right side is not fused. That is, all of the second memory cells MC2 are in the unwritten status.

The total capacitance of the first bit line BLL shown in FIG. 5 is expressed by a formula 1 by using a bit line wiring capacitance of the first bit line BLL.

$$\text{Total capacitance=Bit line wiring capacitance} \qquad \text{(Formula 1)}$$

The total capacitance of the second bit line BLR shown in FIG. 5 is expressed by a formula 2 by using a bit line wiring capacitance of the second bit line BLR, a fuse element capacitance of the second fuse element F2, and a transistor diffusion capacitance of the second access transistor TRA2.

$$\text{Total capacitance=Bit line wiring capacitance+(fuse element capacitance+transistor diffusion capacitance)×Bit count} \qquad \text{(Formula 2)}$$

As shown in the formula 1 and the formula 2, the total capacitance of the second bit line BLR is greater than the total capacitance of the first bit line BLL. Furthermore, since there is a possibility that the total capacitances of the bit lines fluctuate significantly in accordance with a pattern of write data, there is a possibility that the time at which charges that are pre-charged in the bit lines are extracted (the rates of decrease of the voltages of the bit lines) also fluctuate significantly in accordance with the pattern of write data. In this case, in the comparative example, it might become difficult to stably perform a reading operation in which the pre-charge shown in FIG. 4 is used.

On the other hand, the total capacitance of each of the first read bit line RBLL and the second read bit line RBLR shown in FIG. 6 is expressed by a formula 3.

$$\text{Total capacitance=Bit line wiring capacitance+Transistor diffusion capacitance×Bit count} \qquad \text{(Formula 3)}$$

That is, the total capacitance of each of the first read bit line RBLL and the second read bit line RBLR is approximately constant regardless of a pattern of write data. Therefore, the time at which charges that are pre-charged in the bit lines are extracted (the rates of decrease of the voltages of the bit lines) is also approximately constant regardless of the pattern of write data. Therefore, a reading operation in which the pre-charge is used can be performed more stably.

[Comparison of Operation]

In the circuit configuration shown in the comparative example, normally the potential difference between the voltage of the first bit line BLL and the voltage of the second bit line BLR is generated by applying a DC current. The potential difference is amplified and read out by the comparison unit 72.

Figure 7:
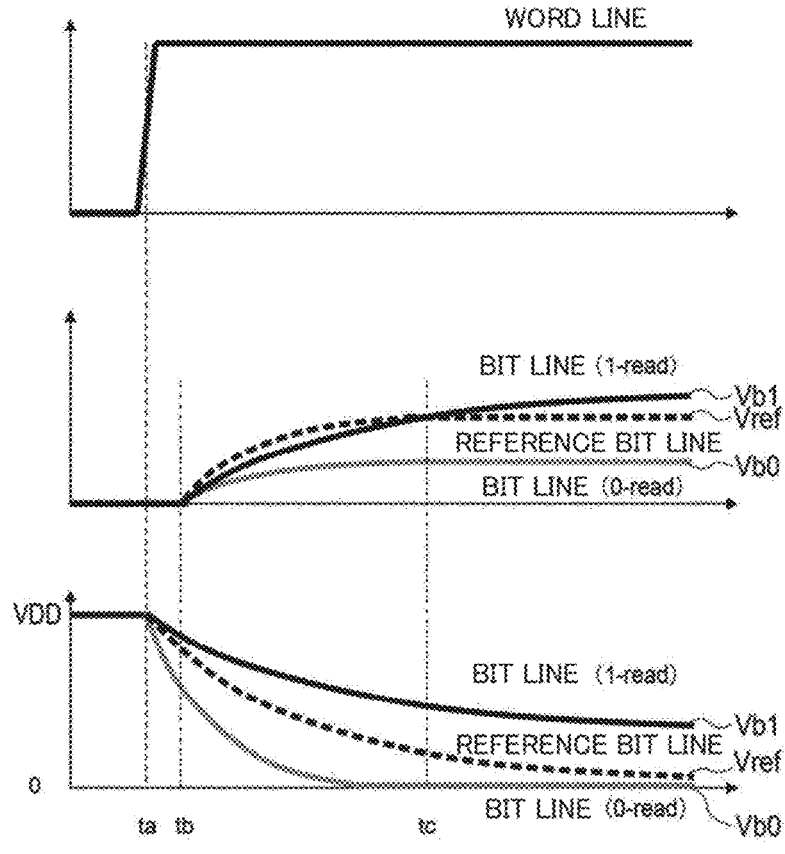
FIG. 7 is a diagram showing a time variation of a voltage of a bit line.

FIG. 7 is a diagram showing a time variation of the voltage of a bit line. The upper part of FIG. 7 is a graph showing a time variation of the voltage of a word line. The middle part of FIG. 7 is a graph showing time variations of the voltages of bit lines in the comparative example. The lower part of FIG. 7 is a graph showing time variations of the voltages of the bit lines in the first embodiment. The vertical axes of the graphs shown in FIG. 7 show voltages. The horizontal axes of the graphs shown in FIG. 7 show time. Note that the time shown by the horizontal axes is common in all graphs.

Examples of the voltage of a word line include the word lines RWL0, RWL1, WL0, and WL1. Bit line voltages Vb0, Vb1 of bit lines connected electrically to the memory cell MC are indicated by solid lines. The bit line voltage Vb0 shows a voltage obtained when the memory cell MC is in the unwritten status. The bit line voltage Vb1 shows a voltage obtained when the memory cell MC is in the write status. A reference voltage Vref of a reference bit line connected electrically to the reference voltage generation unit 71 is indicated by a broken line.

Note that the bit lines and reference bit line in the comparative example correspond to the second bit line BLR and the first bit line BLL shown in FIG. 5, respectively. The bit lines and reference bit line in the first embodiment correspond to the second read bit line RBLR and the first read bit line RBLL shown in FIG. 6, respectively.

The voltages of the word lines are low in the initial state. The voltages of the word lines become high at time ta. In this manner, the word lines are activated. The second fuse element F2 is biased by the power supply voltage VDD, and a DC current flows continuously through the second fuse element F2.

In the initial state in the comparative example, the bit line voltages Vb0, Vb1 and the reference voltage Vref are zero, for example.

The bit line voltages Vb0, Vb1 and the reference voltage Vref rise at time tb after the time ta in the comparative example. Since the fuse element is fused, the bit line voltage Vb1 is higher than the bit line voltage Vb0, and it takes time for the voltages to become stable.

For example, the bit line voltage Vb1 exceeds the reference voltage Vref at time tc in the comparative example. That is, after the time tc, the reference voltage Vref becomes a voltage level between the bit line voltage Vb0 and the bit line voltage Vb1. Thus, in the comparative example, the comparison unit 72 needs to wait long enough for at least the time tc to pass, to perform the comparison.

As described above, in the comparative example, a DC current needs to be applied continuously from the word line activation until the sense amplifier activation. Also, it takes a relatively long time for the potential difference between the bit line voltages Vb0, Vb1 and the reference voltage Vref to grow sufficiently.

Note that the time variations of the bit line voltages Vb0, Vb1 and the reference voltage Vref according to the comparative example are examples.

In the initial state in the first embodiment, the bit line voltages Vb0, Vb1 and the reference voltage Vref are pre-charged to the power supply voltage VDD.

The voltages of the word lines become high at time ta in the first embodiment. Also at the time ta, the bit line voltages Vb0, Vb1 and the reference voltage Vref decrease. This is because the first access transistor TRA1 and the second access transistor TRA2 are turned on and the charges are extracted from the first read bit line RBLL and the second read bit line RBLR. The rate of decrease of the reference voltage Vref after the time ta is between the rate of decrease of the bit line voltage Vb0 and the rate of decrease of the bit line voltage Vb1.

In the first embodiment, as compared to the comparative example, it is not necessary to continuously apply a DC current. This is because pre-charged charges are extracted. Therefore, power consumption can be reduced. In addition, the potential difference between the bit line voltages Vb0, Vb1 and the reference voltage Vref can be obtained easily, and a readout margin can be ensured. Moreover, the access transistors are arranged between the fuse elements and the read bit lines. Thus, the voltage change rates (rate of decrease) of the bit lines that occur when charges are extracted can be prevented from varying depending on the pattern of the write data. As a result, the reading operations can be performed in a stable manner. Further, as shown in FIG. 7, in the first embodiment, as compared to the comparative example, the potential difference between the bit line voltages Vb0, Vb1 and the reference voltage Vref grows quickly. Consequently, the time taken from the word line activation to the sense amplifier activation can be reduced. As a result, high-speed reading operations can be achieved.

As shown in the lower part of FIG. 7, in the first embodiment, the potential difference between the bit line voltages Vb0, Vb1 and the reference voltage Vref occurs in a relatively short time since the word line activation, in accordance with the difference in speed of charge extraction. Since the difference in speed of charge extraction occurs depending on the difference in resistance value, there is a possibility that a sufficient potential difference can be extracted regardless of the pre-charge voltage obtained when reading is started. For example, the power supply voltage VDD can be reduced to the extent that the comparison unit 72 can perform the comparison appropriately. In this manner, voltage reduction can be achieved. That is, the potential difference between the first voltage and the second voltage is a potential difference corresponding to the difference in voltage change rate between the first read bit line RBLL and the second read bit line RBLR which is obtained when the decoder 4 turns the first access transistor TRA1 or the second access transistor TRA2 on.

Second Embodiment

Figure 8:
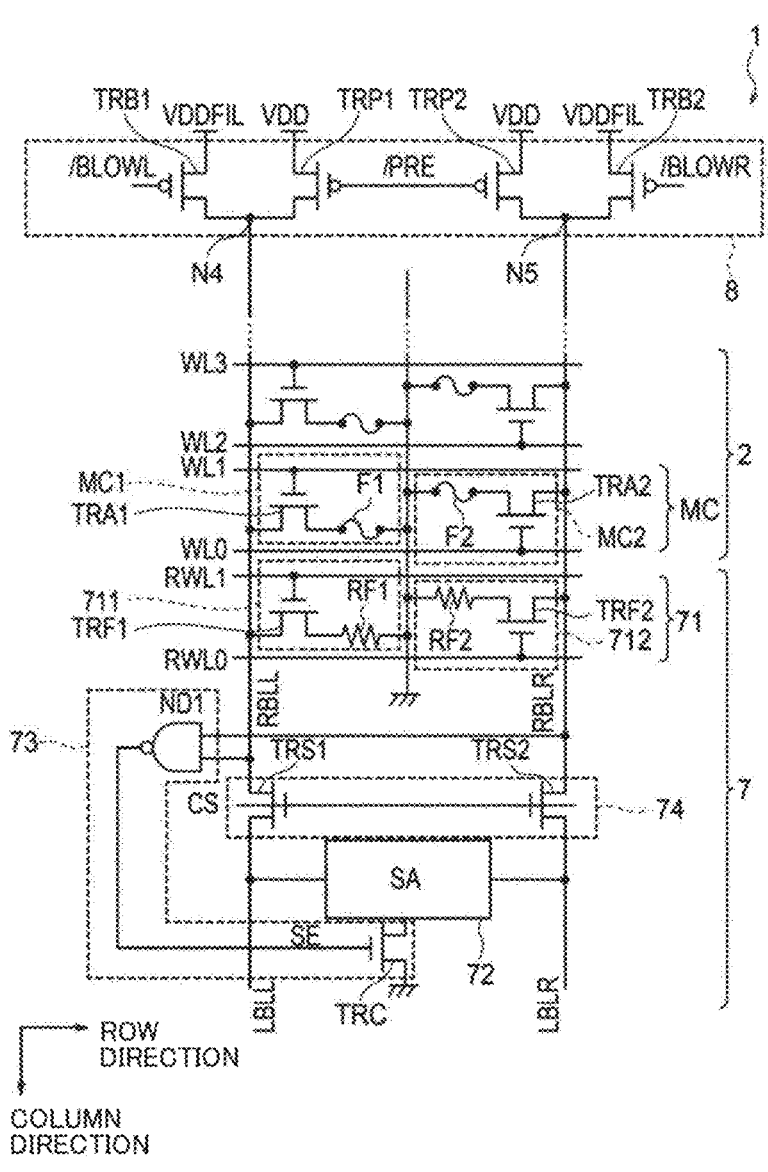
FIG. 8 is a circuit diagram showing a detailed configuration example of a semiconductor storage device according to a second embodiment.

FIG. 8 is a circuit diagram showing a detailed configuration example of the semiconductor storage device 1 according to a second embodiment. The second embodiment is different from the first embodiment in that the write bit line WBL is connected to the ground. Note that the write bit line WBL of the second embodiment corresponds to the ground line GND of the comparative example.

In the example shown in FIG. 8, the first voltage in a writing operation is, for example, the fuse power supply voltage VDDFIL. The second voltage in the writing operation is, for example, the ground voltage (0 V). Therefore, in the writing operation, the first voltage is higher than the second voltage. The first voltage in a reading operation is, for example, the power supply voltage VDD. The second voltage in the reading operation is, for example, the ground voltage. Therefore, in the reading operation, the first voltage is higher than the second voltage. Note that the first voltage in the writing operation (fuse power supply voltage VDD-FIL) is higher than the first voltage in the reading operation (power supply voltage VDD).

The voltage supply unit 8 in the second embodiment is not provided with the third blow transistor TRB3 and the read transistor TRR, as compared to the first embodiment.

The first blow transistor TRB1 is connected between node N4 on the first read bit line RBLL and the fuse power supply voltage node VDDFIL. A /BLOWL signal is input to the gate of the first blow transistor TRB1. The first blow transistor TRB1 is, for example, a PMOS transistor.

The second blow transistor TRB2 is connected between a node N5 on the second read bit line RBLR and the fuse power supply voltage node VDDFIL. A /BLOWR signal is input to the gate of the second blow transistor TRB2. The second blow transistor TRB2 is, for example, a PMOS transistor.

The first pre-charge transistor TRP1 is connected between the node N4 on the first read bit line RBLL and the power supply voltage node VDD.

The second pre-charge transistor TRP2 is connected between the node N5 on the second read bit line RBLR and the power supply voltage node VDD.

Note that the write bit line WBL is connected to the ground and fixed to the ground voltage. That is, the voltage supply unit 8 fixes the write bit line WBL to the second voltage (ground voltage).

[Writing Operation of Semiconductor Storage Device]

Figure 9:
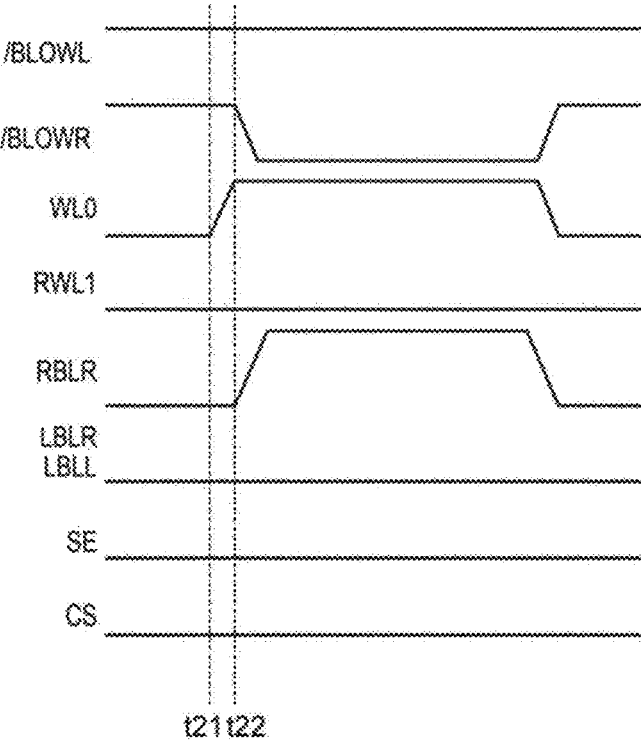
FIG. 9 is a timing chart showing an example of a writing operation of the semiconductor storage device according to the second embodiment.

FIG. 9 is a timing chart showing an example of a writing operation of the semiconductor storage device 1 according to the second embodiment.

In the initial state, the/BLOWL signal and the/BLOWR signal are in a high state. Thus, the first blow transistor TRB1 and the second blow transistor TRB2 are in an OFF state. The signals of the word lines WL0, RWL1 are in a low state.

Therefore, the second access transistor TRA2 and the first reference transistor TRF1 are in an OFF state.

First, at time t21, the signal of the word line WL0 is high. Thus, the second access transistor TRA2 turns on.

Next, at time t22, the/BLOWR signal becomes low. As a result, the second blow transistor TRB2 is turned on. As a result, the voltage of the second read bit line RBLR rises, and the second fuse element F2 is biased by the fuse power supply voltage VDDFIL and enters the write status.

Thereafter, the/BLOWR signal becomes high, and the signal of the word line WL0 becomes low. As a result, the blow transistor TRB2 is turned off, and the second access transistor TRA 2 is turned off.

[Reading Operation of Semiconductor Storage Device]

Figure 10:
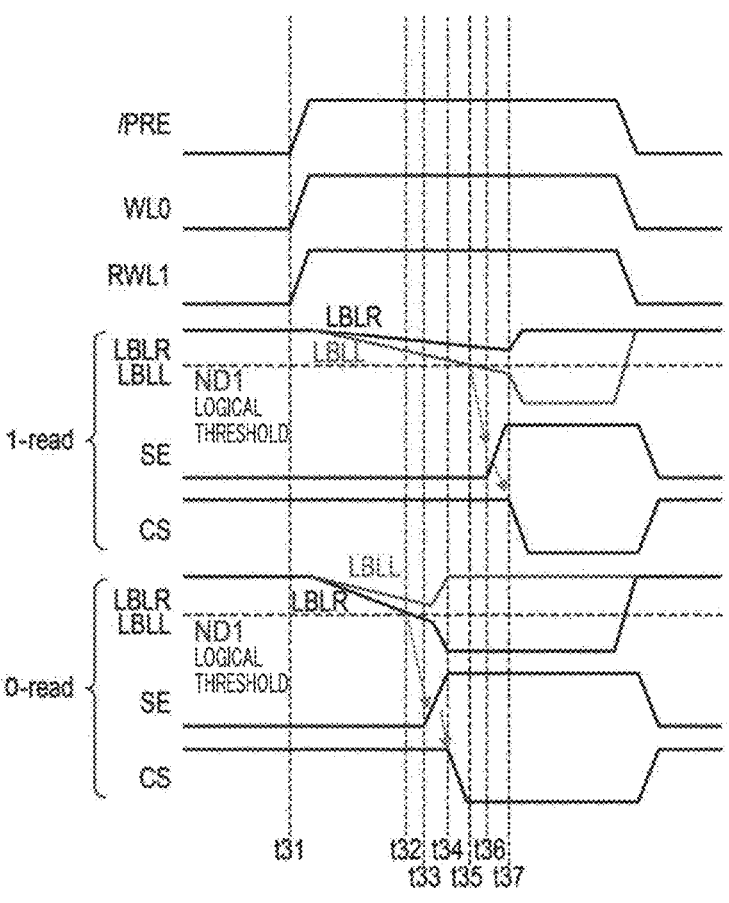
FIG. 10 is a timing chart showing an example of a reading operation of the semiconductor storage device according to the second embodiment.

FIG. 10 is a timing chart showing an example of a reading operation of the semiconductor storage device 1 according to the second embodiment.

In FIG. 10, the READ signal is not input. The other reading operations of the semiconductor storage device 1 according to the second embodiment are the same as those shown in FIG. 4 described in the first embodiment.

As in the second embodiment, the write bit line WBL may be connected to the ground. Also in this case, the same advantageous effects as those of the first embodiment can be obtained.

Third Embodiment

Figure 11:
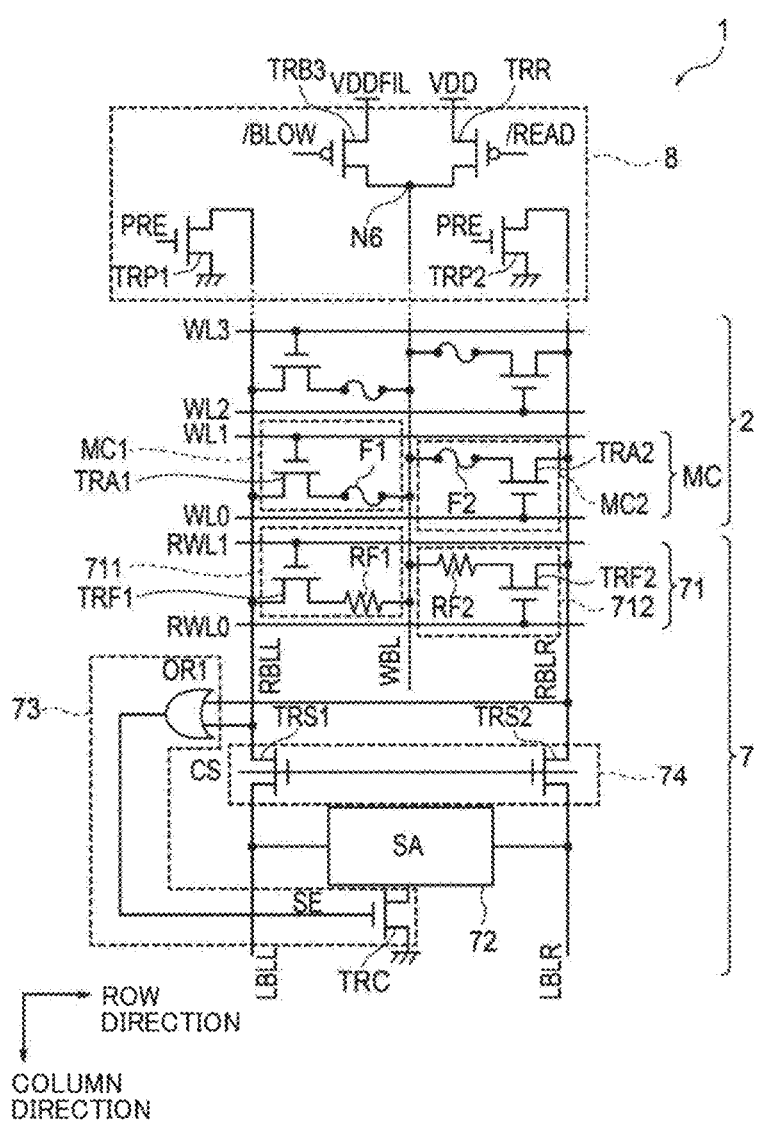
FIG. 11 is a circuit diagram showing a detailed configuration example of a semiconductor storage device according to a third embodiment.

FIG. 11 is a circuit diagram showing a detailed configuration example of the semiconductor storage device 1 according to a third embodiment. The third embodiment is different from the first embodiment in that the pre-charge levels of the first read bit line RBLL and the second read bit line RBLR are 0V.

In the example shown in FIG. 11, the first voltage in a writing operation is, for example, the ground voltage (0V). The second voltage in the writing operation is, for example, the fuse power supply voltage VDDFIL. Therefore, in the writing operation, the first voltage is lower than the second voltage. The first voltage in a reading operation is, for example, the ground voltage. The second voltage in the reading operation is, for example, the power supply voltage VDD. Therefore, in the reading operation, the first voltage is lower than the second voltage. Note that the second voltage in the writing operation (fuse power supply voltage VDD-FIL) is higher than the second voltage in the reading operation (power supply voltage VDD).

The voltage supply unit 8 in the third embodiment is not provided with the first blow transistor TRB1 and the second blow transistor TRB2, as compared to the first embodiment.

The third blow transistor TRB3 is connected between a node N6 on the write bit line WBL and the fuse power supply voltage node VDDFIL.

The read transistor TRR is connected between the node N6 on the write bit line WBL and the power supply voltage node VDD. A/READ signal is input to the gate of the read transistor TRR. The read transistor TRR is, for example, a PMOS transistor.

The first pre-charge transistor TRP1 is connected between one end of the first read bit line RBLL and the ground. A PRE signal is input to the gate of the first pre-charge transistor TRP1. The first pre-charge transistor TRP1 is, for example, an NMOS transistor.

The second pre-charge transistor TRP2 is connected between one end of the second read bit line RBLR and the ground. A PRE signal is input to the gate of the second pre-charge transistor TRP2. The second pre-charge transistor TRP2 is, for example, an NMOS transistor.

The comparison control unit 73 has an OR circuit OR1 instead of the NAND circuit ND1 of the first embodiment.

Two input units of the OR circuit OR1 are electrically connected to the first read bit line RBLL and the second read bit line RBLR. An output unit of the OR circuit OR1 is electrically connected to the gate of the comparison control transistor TRC. When the voltage of at least either one of the first read bit line RBLL and the second read bit line RBLR is smaller than a second predetermined value, the OR circuit OR1 outputs a high signal.

[Writing Operation of Semiconductor Storage Device]

Figure 12:
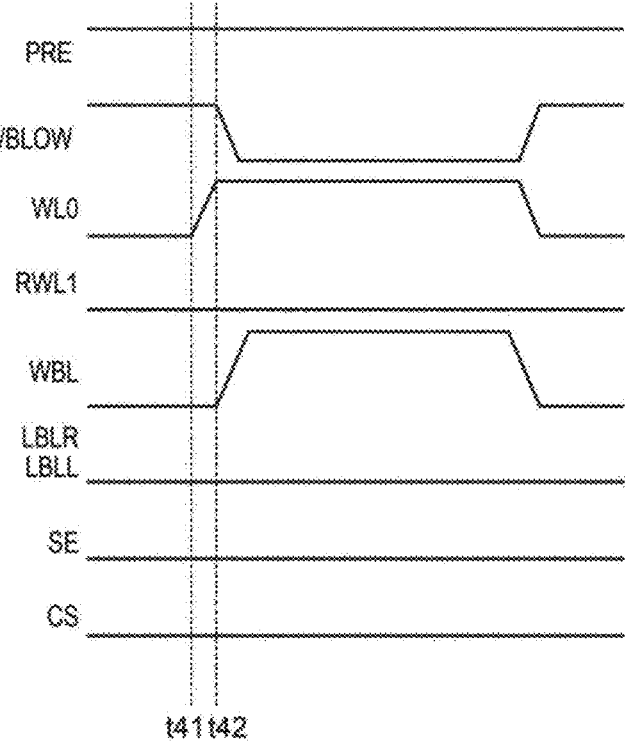
FIG. 12 is a timing chart showing an example of a writing operation of the semiconductor storage device according to the third embodiment.

FIG. 12 is a timing chart showing an example of a writing operation of the semiconductor storage device 1 according to the third embodiment.

In the initial state, the PRE signal is in a high state. Thus, the first pre-charge transistor TRP1 and the second pre-charge transistor TRP2 are in the ON state.

During the writing operation, the first pre-charge transistor TRP1 and the second pre-charge transistor TRP2 operate in substantially the same manner as the first blow transistor TRB1 and the second blow transistor TRB2 of the first embodiment. The other operations of the semiconductor storage device 1 according to the third embodiment are the same as those shown in FIG. 3 described in the first embodiment.

During the writing operation, the/READ signal, not shown, is in a high state. Thus, the read transistor TRR is in the OFF state.

[Reading Operation of Semiconductor Storage Device]

Figure 13:
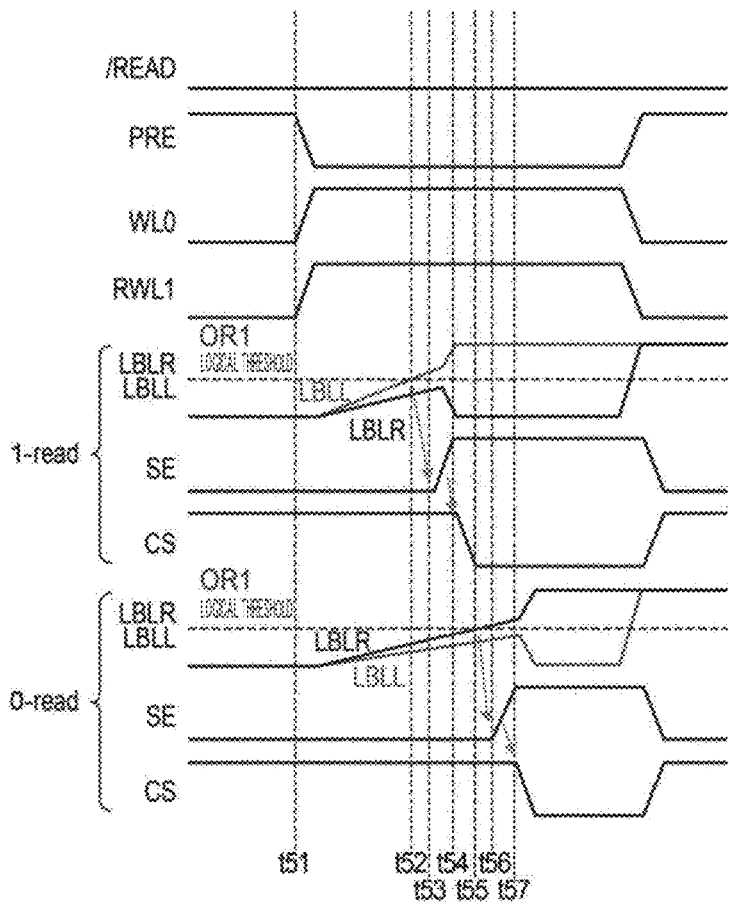
FIG. 13 is a timing chart showing an example of a reading operation of the semiconductor storage device according to the third embodiment.

FIG. 13 is a timing chart showing an example of a reading operation of the semiconductor storage device 1 according to the third embodiment.

In the initial state, the/READ signal is in a low state. Therefore, the read transistor TRR is in the ON state. As a result, the write bit line WBL is pre-charged to the power supply voltage VDD. All the first access transistors TRA1, all the second access transistors TRA2, the first reference transistor TRF1, and the second reference transistor TRF2, which are shown in FIG. 11, are in the OFF state. Therefore, regardless of whether the status of the memory cell MC is the write status ("1") or unwritten status ("0"), charges accumulate in the write bit line WBL without being extracted.

In the initial state, the PRE signal is in a high state. Therefore, the first pre-charge transistor TRP1 and the second pre-charge transistor TRP2 are in the ON state. As a result, the voltages of the first read bit line RBLL (first separation read bit line LBLL) and the second read bit line RBLR (second separation read bit line LBLR) are discharged to, for example, 0V.

At time t51, the PRE signal becomes low. In this manner, the first pre-charge transistor TRP1 and the second pre-charge transistor TRP2 are turned off. The signals of the word lines WL0, RWL1 become high at substantially the same time. In this manner, the second access transistor TRA2 and the first reference transistor TRF1 are turned on at substantially the same time. As a result, after the time t51, the voltages of the first separation read bit line LBLL and the second separation read bit line LBLR rise. This is because the first separation read bit line LBLL and the second separation read bit line LBLR that have been discharged to 0V are charged to the level of the power supply voltage VDD via the read transistor TRR and the write bit line WBL.

Here, the rate of increase in voltage varies between the first separation read bit line LBLL and the second separation read bit line LBLR. The rate of increase of the voltage of the first separation read bit line LBLL is determined by the resistance value of the first reference resistance element RF1. Thus, the rate of increase of the voltage of the first separation read bit line LBLL does not change by the status of the second fuse element F2 (0/1) possessed by the second memory cell MC2. On the other hand, the rate of increase of the voltage of the second separation read bit line LBLR changes by the status of the second fuse element F2 (0/1) possessed by the second memory cell MC2.

First, a reading operation performed when the second memory cell MC2 is in the write status will be described (1-read).

Since the resistance value of the second fuse element F2 of the second memory cell MC2 is higher than the resistance value of the first reference resistance element RF1, the rate of increase of the voltage of the second separation read bit line LBLR is slower than the rate of increase of the voltage of the first separation read bit line LBLL.

At time t52, the voltage of the first separation read bit line LBLL becomes higher than the logical threshold (second predetermined value) of the OR circuit OR1. Consequently, at time t53, the OR circuit OR1 inputs the signal SE that changes from low to high, to the gate of the comparison control transistor TRC. In addition, due to the signal SE becoming high, the signal CS becomes low at time t54. Consequently, the first separation transistor TRS1 and the second separation transistor TRS2 are turned off. As a result, the first read bit line RBLL and the second read bit line RBLR are electrically disconnected from the first separation read bit line LBLL and the second separation read bit line LBLR, respectively.

At time t53, the comparison control transistor TRC is turned on, thereby voltage comparison by the comparison unit 72 is performed. That is, the comparison control unit 73 causes the comparison unit 72 to perform the comparison at a timing at which the voltage of at least either one of the first read bit line RBLL and the second read bit line RBLR becomes higher than the second predetermined value. After the time t53, the comparison unit 72 performs the comparison by amplifying the potential difference between the first separation read bit line LBLL and the second separation read bit line LBLR.

Thereafter, the PRE signal becomes high and the signals of the word lines WL0, RWL1 become low. Consequently, the first pre-charge transistor TRP1 and the second pre-charge transistor TRP2 are turned on, and the second access transistor TRA2 and the first reference transistor TRF1 are turned off.

Next, a reading operation performed when the second memory cell MC2 is in the unwritten status will be described (0-read).

Since the resistance value of the second fuse element F2 of the second memory cell MC2 is lower than the resistance value of the first reference resistance element RF1, the rate of increase of the voltage of the second separation read bit line LBLR is faster than the rate of increase of the voltage of the first separation read bit line LBLL.

At time t55, the voltage of the second separation read bit line LBLR becomes higher than the logical threshold (second predetermined value) of the OR circuit OR1. Consequently, at time t55, the OR circuit OR1 inputs the signal SE that changes from low to high, to the gate of the comparison control transistor TRC. In addition, due to the signal SE becoming high, the signal CS becomes low at time t57. Consequently, the first separation transistor TRS1 and the second separation transistor TRS2 are turned off. As a result, the first read bit line RBLL and the second read bit line RBLR are electrically disconnected from the first separation read bit line LBLL and the second separation read bit line LBLR, respectively.

At time t56, the comparison control transistor TRC is turned on, thereby voltage comparison by the comparison unit 72 is performed. That is, the comparison control unit 73 causes the comparison unit 72 to perform the comparison at a timing at which the voltage of at least either one of the first read bit line RBLL and the second read bit line RBLR becomes higher than the second predetermined value. After the time t56, the comparison unit 72 performs the comparison by amplifying the potential difference between the first separation read bit line LBLL and the second separation read bit line LBLR.

Thereafter, the PRE signal becomes high and the signals of the word lines WL0, RWL1 become low. Consequently, the first pre-charge transistor TRP1 and the second pre-charge transistor TRP2 are turned on, and the second access transistor TRA2 and the first reference transistor TRF1 are turned off.

As shown in FIG. 13, the timing at which the comparison is started by the comparison unit 72 differs depending on the status (0/1) of the second memory cell MC2. That is, the timing from a voltage rise in the word lines to the sense amplifier activation is determined in a self-alignment manner based on the rate at which either the first separation read bit line LBLL or the second separation read bit line LBLR whichever becomes higher than the logical threshold (second predetermined value) of the OR circuit OR1 first.

As in the third embodiment, the pre-charge levels of the first read bit line RBLL and the second read bit line RBLR may be 0V. Also in this case, the same advantageous effects as those of the first embodiment can be obtained.

Fourth Embodiment

Figure 14:
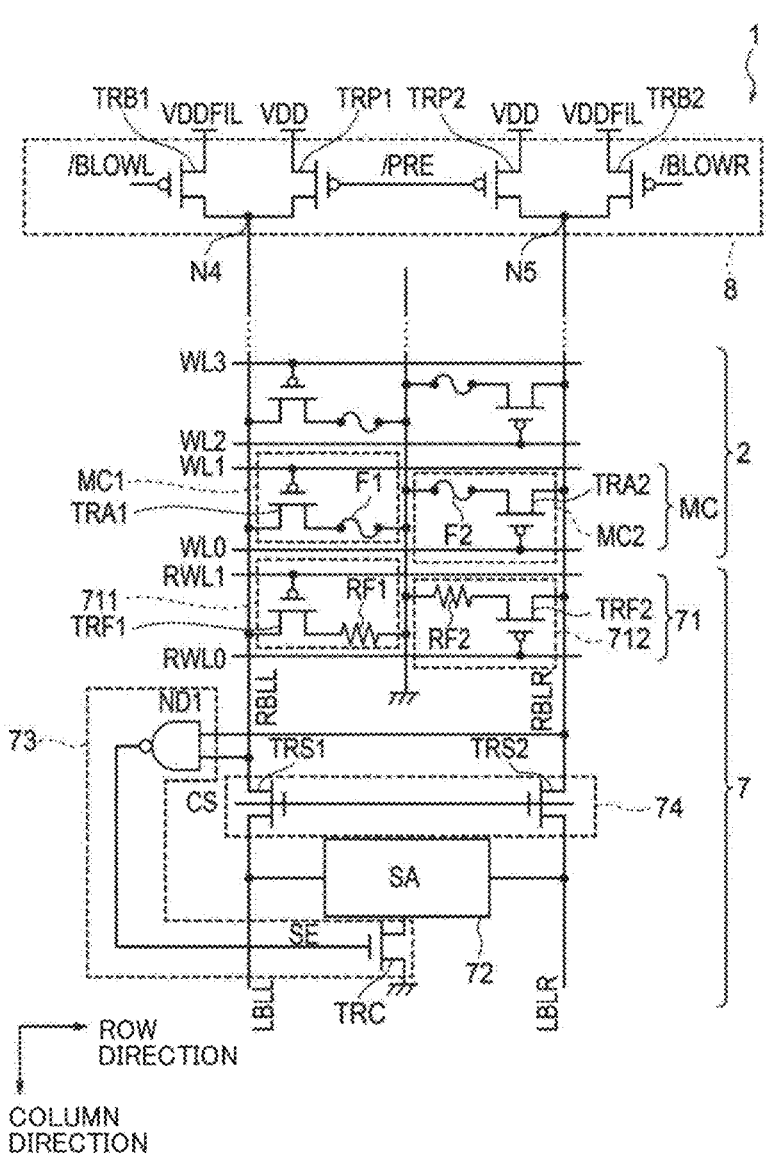
FIG. 14 is a circuit diagram showing a detailed configuration example of a semiconductor storage device according to a fourth embodiment.

FIG. 14 is a circuit diagram showing a detailed configuration example of the semiconductor storage device 1 according to a fourth embodiment. The fourth embodiment is different from the second embodiment in that the transistors included in the memory cell MC and the reference voltage generation unit 71 are PMOS transistors.

The first access transistor TRA1, the second access transistor TRA2, the first reference transistor TRF1, and the second reference transistor TRF2 are, for example, PMOS transistors.

[Writing Operation of Semiconductor Storage Device]

Figure 15:
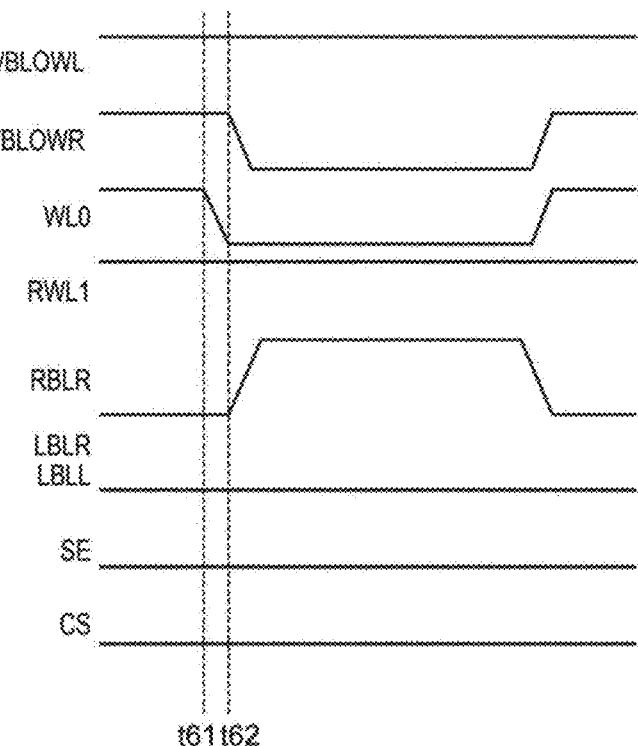
FIG. 15 is a timing chart showing an example of a writing operation of the semiconductor storage device according to the fourth embodiment.

FIG. 15 is a timing chart showing an example of a writing operation of the semiconductor storage device 1 according to the second embodiment.

In the fourth embodiment, as compared to the second embodiment, the high-low relationship of the signals between the word lines WL0 and RWL1 is reversed. The other writing operations of the semiconductor storage device 1 according to the fourth embodiment are the same as those shown in FIG. 9 described in the second embodiment.

[Reading Operation of Semiconductor Storage Device]

Figure 16:
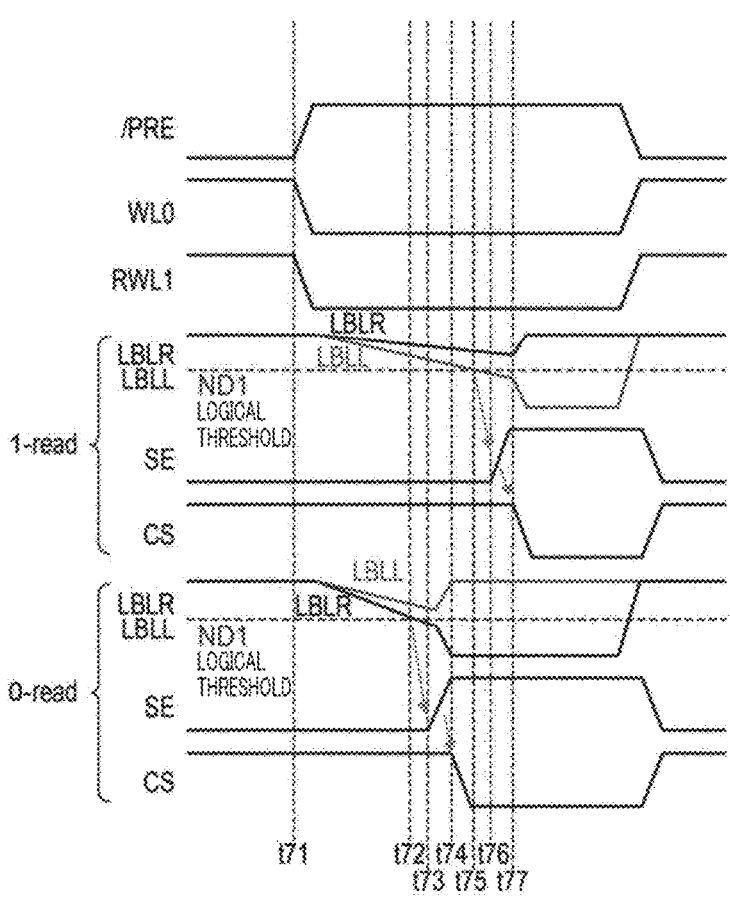
FIG. 16 is a timing chart showing an example of a reading operation of the semiconductor storage device according to the fourth embodiment.

FIG. 16 is a timing chart showing an example of a reading operation of the semiconductor storage device 1 according to the fourth embodiment.

In the fourth embodiment, as compared to the second embodiment, the high-low relationship of the signals between the word lines WL0 and RWL1 is reversed. The other reading operations of the semiconductor storage device 1 according to the fourth embodiment are the same as those shown in FIG. 10 described in the second embodiment.

As in the fourth embodiment, the transistors included in the memory cell MC and the reference voltage generation unit 71 may be PMOS transistors. Also in this case, the same advantageous effects as those of the second embodiment can be obtained. Note that, in the first embodiment or the third embodiment as well, the transistors included in the memory cell MC and the reference voltage generation unit 71 may be PMOS transistors.

The present technique can also take on the following configurations.

(1)

A semiconductor storage device, comprising:

one or more first memory cells connected in parallel between a first voltage supply line supplying a first voltage and a second voltage supply line supplying a second voltage different from the first voltage; and one or more second memory cells connected in parallel between the second voltage supply line and a third voltage supply line supplying the first voltage, wherein each of the first memory cells includes:

a first storage element having a resistance value corresponding to a first status or a second status; and a first cell transistor connected between the first storage element and the first voltage supply line, and each of the second memory cells includes:

a second storage element having a resistance value corresponding to a first status or a second status; and a second cell transistor connected between the second storage element and the third voltage supply line.

(2)

The semiconductor storage device according to (1), wherein the number of first memory cells and the number of second memory cells are the same.

(3)

The semiconductor storage device according to (1) or (2), wherein the first memory cells and the second memory cells are arranged approximately symmetrically with the second voltage supply line therebetween.

(4)

The semiconductor storage device according to any one of (1) to (3), further comprising:

a voltage supply unit that, in a reading operation of the first memory cells or the second memory cells, causes the first voltage supply line and the third voltage supply line to supply the first voltage, causes the second voltage supply line to supply the second voltage, and stops the supply of the first voltage; and a cell transistor control unit that turns on the first cell transistors of the first cells to be read or the second cell transistors of the second memory cells to be read while the supply of the first voltage is being stopped.

(5)

The semiconductor storage device according to (4), wherein a potential difference between the first voltage and the second voltage is a potential difference corresponding to a difference in voltage change rate between the first voltage supply line and the third voltage supply line that is obtained after the cell transistor control unit turns on the first cell transistors or the second cell transistors.

(6)

The semiconductor storage device according to (4) or (5), wherein the second voltage supply line is fixed to the second voltage.

(7)

The semiconductor storage device according to any one of (1) to (6), further comprising:

a reference voltage generation unit that generates a reference voltage having a voltage level between a voltage that is generated by having the first storage elements and the second storage elements biased based on the first voltage and the second voltage, the first storage elements and the second storage elements having a resistance value corresponding to the first status, and a voltage that is generated by having the first storage elements and the second storage elements biased based on the first voltage and the second voltage, the first storage elements and the second storage element having a resistance value corresponding to the second status; and a comparison unit that compares the reference voltage with a voltage that is generated by having the first storage elements or the second storage elements biased based on the first voltage and the second voltage.

(8)

The semiconductor storage device according to (7), wherein the reference voltage generation unit is configured to include:

a first reference voltage generation unit that is connected between the first voltage supply line and the second voltage supply line and generates the reference voltage when a reading operation of the second memory cells is performed; and a second reference voltage generation unit that is connected between the second voltage supply line and the third voltage supply line and generates the reference voltage when a reading operation of the first memory cells is performed.

(6)

The semiconductor storage device according to (8), wherein the first reference voltage generation unit and the second reference voltage generation unit are arranged approximately symmetrically with the second voltage supply line therebetween.

(10)

The semiconductor storage device according to (8) or (9), wherein the first reference voltage generation unit is configured to include:

a first reference resistance element; and a first reference transistor that is connected between the first reference resistance element and the first voltage supply line, and the second reference voltage generation unit is configured to include:

a second reference resistance element; and a second reference transistor that is connected between the second reference resistance element and the third voltage supply line.

(11)

The semiconductor storage device according to any one of (7) to (10), wherein the comparison unit is configured to compare the reference voltage with the voltage that is generated by having the first storage elements or the second storage elements biased based on the first voltage and the second voltage, by comparing a voltage of the first voltage supply line with a voltage of the third voltage supply line, and the semiconductor storage device further includes a comparison control unit that causes the comparison unit to start comparing at a timing corresponding to the voltages of the first voltage supply line and the third voltage supply line.

(12)

The semiconductor storage device according to (11), wherein the comparison control unit is configured to, when the first voltage is higher than the second voltage, cause the comparison unit to start comparing at a timing at which the voltage of at least either one of the first voltage supply line and the third voltage supply line becomes lower than a first predetermined value, and when the first voltage is lower than the second voltage, cause the comparison unit to start comparing at a timing at which the voltage of at least either one of the first voltage supply line and the third voltage supply line becomes higher than a second predetermined value.

(13)

The semiconductor storage device according to any one of (1) to (12), wherein, in a reading operation, the first voltage is higher than the second voltage.

(14)

The semiconductor storage device according to (13), wherein, in a writing operation, the first voltage is lower than the second voltage, and the second voltage obtained in a writing operation is higher than the first voltage obtained in a reading operation.

(15)

The semiconductor storage device according to (13), wherein, in a writing operation, the first voltage is higher than the second voltage, and the first voltage obtained in a writing operation is higher than the first voltage obtained in a reading operation.

(16)

The semiconductor storage device according to any one of (1) to (12), wherein, in a reading operation, the first voltage is lower than the second voltage.

(17)

The semiconductor storage device according to (16), wherein, in a writing operation, the first voltage is lower than the second voltage, and the second voltage obtained in a writing operation is higher than the second voltage obtained in a reading operation.

Aspects of the present disclosure are not limited to the aforementioned individual embodiments and include various modifications that those skilled in the art can achieve, and advantageous effects of the present disclosure are also not limited to the details described above. In other words, various additions, modifications, and partial deletion can be made without departing from the conceptual idea and the gist of the present disclosure that can be derived from the details defined in the claims and the equivalents thereof.

REFERENCE SIGNS LIST

1 Semiconductor storage device
2 Memory cell array
4 Decoder
7 Readout circuit
71 Reference voltage generation unit
711 First reference voltage generation unit
712 Second reference voltage generation unit
72 Comparison unit
73 Comparison control unit
8 Voltage supply unit
F Fuse element
F1 First fuse element
F2 Second fuse element
MC Memory cell
MC1 First memory cell
MC2 Second memory cell
TRA1 First access transistor
TRA2 Second access transistor
RBLL First read bit line
RBLR Second read bit line
LBLL First separation read bit line
LBLR Second separation read bit line
WBL Write bit line
RF1 First reference resistance element RF2 Second reference resistance element
TRF1 First reference transistor
TRF2 Second reference transistor
VDD Power supply voltage
VDDFIL Fuse power supply voltage

The invention claimed is:

1. A semiconductor storage device, comprising:

at least one first memory cell of a plurality of first memory cells, wherein the at least one first memory cell is connected in parallel between a first voltage supply line and a second voltage supply line, the first voltage supply line supplies a first voltage, and the second voltage supply line supplies a second voltage different from the first voltage; and at least one second memory cell of a plurality of second memory cells, wherein the at least one second memory cell is connected in parallel between the second voltage supply line and a third voltage supply line, the third voltage supply line supplies the first voltage, each of the plurality of first memory cells includes:

a first storage element having a first resistance value corresponding to one of a first status or a second status; and a first cell transistor connected between the first storage element and the first voltage supply line, and each of the plurality of second memory cells includes:

a second storage element having a second resistance value corresponding to one of the first status or the second status; and a second cell transistor connected between the second storage element and the third voltage supply line;

a reference voltage generation unit configured to generate a reference voltage having a voltage level between a third voltage and a fourth voltage, wherein the third voltage is generated based on a first biasing operation on each of the first storage element and the second storage element, the first biasing operation on the each of the first storage element and the second storage element is based on:

the first voltage, the second voltage, the first resistance value of the first storage element that corresponds to the first status, and the second resistance value of the second storage element that corresponds to the first status, the fourth voltage is generated based on a second biasing operation on the each of the first storage element and the second storage element, the second biasing operation on the each of the first storage element and the second storage element is based on;

the first voltage, the second voltage, the first resistance value of the first storage element that corresponds to the second status, and the second resistance value of the second storage element that corresponds to the second status; and a comparison unit configured to compare the reference voltage with a fifth voltage, wherein the fifth voltage is generated based on a third biasing operation on one of the first storage element or the second storage element, the third biasing operation on the one of the first storage element or the second storage element is biased based on each of the first voltage and the second voltage, the reference voltage generation unit includes:

a first reference voltage generation unit that is connected between the first voltage supply line and the second voltage supply line, wherein the first reference voltage generation unit is configured to generate, based on a reading operation of the at least one second memory cell, the reference voltage; and a second reference voltage generation unit that is connected between the second voltage supply line and the third voltage supply line, wherein the second reference voltage generation unit is configured to generate, based on a reading operation of the at least one first memory cell, the reference voltage, and the second voltage supply line is between the first reference voltage generation unit and the second reference voltage generation unit.

2. The semiconductor storage device according to claim 1, wherein a number of the plurality of first memory cells is equal to a number of the plurality of second memory cells.

3. The semiconductor storage device according to claim 1, wherein the second voltage supply line is between the at least one first memory cell and the at least one second memory cell.

4. The semiconductor storage device according to claim 1, further comprising:

a voltage supply unit configured to:

control, based on the reading operation of one of the at least one first memory cell or the at least one second memory cell, each of the first voltage supply line and the third voltage supply line to supply the first voltage;

control the second voltage supply line to supply the second voltage; and stop the supply of the first voltage; and a cell transistor control unit configured to turn on, based on the supply of the first voltage being stopped, one of the first cell transistor of the at least one first memory cell to be read or the second cell transistor of the at least one second memory cell to be read.

5. The semiconductor storage device according to claim 4, wherein the comparison unit is further configured to determine a potential difference between the first voltage and the second voltage, wherein the potential difference corresponds to a difference in a voltage change rate between the first voltage supply line and the third voltage supply line, and the potential difference is determined after the one of the first cell transistor or the second cell transistor is turned on.

6. The semiconductor storage device according to claim 4, wherein the second voltage supply line is fixed to the second voltage.

7. The semiconductor storage device according to claim 1, wherein the first reference voltage generation unit includes:

a first reference resistance element; and a first reference transistor that is connected between the first reference resistance element and the first voltage supply line, and the second reference voltage generation unit includes:

a second reference resistance element; and a second reference transistor that is connected between the second reference resistance element and the third voltage supply line.

8. The semiconductor storage device according to claim 1, wherein the comparison unit is further configured to:

compare a sixth voltage of the first voltage supply line with a seventh voltage of the third voltage supply line; and compare, based on the comparison of the sixth voltage of the first voltage supply line with the seventh voltage of the third voltage supply line, the reference voltage with the fifth voltage, each of the sixth voltage and the seventh voltage is different from the first voltage, and the semiconductor storage device further includes a comparison control unit configured to control the comparison unit to start the comparison of the reference voltage with the fifth voltage at a timing corresponding to the sixth voltage of the first voltage supply line and the seventh voltage of the third voltage supply line.

9. The semiconductor storage device according to claim 8, wherein the comparison control unit is further configured to:

control, based on the first voltage being higher than the second voltage, the comparison unit to start the comparison of the reference voltage with the fifth voltage at a timing at which one of the sixth voltage or the seventh voltage is lower than a first value, and control, based on the first voltage being lower than the second voltage, the comparison unit to start the comparison of the reference voltage with the fifth voltage at a timing at which the one of the sixth voltage or the seventh voltage is higher than a second value.

10. The semiconductor storage device according to claim 1, wherein, in the reading operation of one of the at least one first memory cell or the at least one second memory cell, the first voltage is higher than the second voltage.

11. The semiconductor storage device according to claim 10, wherein in a writing operation, the first voltage is lower than the second voltage, and the second voltage obtained in the writing operation is higher than the first voltage obtained in the reading operation of the one of the at least one first memory cell or the at least one second memory cell.

12. The semiconductor storage device according to claim 10, wherein in a writing operation, the first voltage is higher than the second voltage, and the first voltage obtained in the writing operation is higher than the first voltage obtained in the reading operation of the one of the at least one first memory cell or the at least one second memory cell.

13. The semiconductor storage device according to claim 1, wherein, in the reading operation of one of the at least one first memory cell or the at least one second memory cell, the first voltage is lower than the second voltage.

14. The semiconductor storage device according to claim 13, wherein in a writing operation, the first voltage is lower than the second voltage, and the second voltage obtained in the writing operation is higher than the second voltage obtained in the reading operation of the one of the at least one first memory cell or the at least one second memory cell.

* * * * *